(12) United States Patent
Kanzaki et al.

(10) Patent No.: US 10,340,390 B2
(45) Date of Patent: Jul. 2, 2019

(54) SEMICONDUCTOR DEVICE AND METHOD FOR PRODUCING THE SAME

(71) Applicant: Sharp Kabushiki Kaisha, Sakai, Osaka (JP)

(72) Inventors: Yohsuke Kanzaki, Sakai (JP); Takao Saitoh, Sakai (JP); Yutaka Takamaru, Sakai (JP); Keisuke Ide, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 16 days.

(21) Appl. No.: 15/569,422

(22) PCT Filed: Jun. 2, 2016

(86) PCT No.: PCT/JP2016/066477
§ 371 (c)(1),
(2) Date: Oct. 26, 2017

(87) PCT Pub. No.: WO2016/199679
PCT Pub. Date: Dec. 15, 2016

(65) Prior Publication Data
US 2018/0301561 A1 Oct. 18, 2018

(30) Foreign Application Priority Data

Jun. 8, 2015 (JP) .................................. 2015-115946

(51) Int. Cl.
*H01L 27/14* (2006.01)
*H01L 29/786* (2006.01)
(Continued)

(52) U.S. Cl.
CPC ...... *H01L 29/7869* (2013.01); *H01L 29/1054* (2013.01); *H01L 29/24* (2013.01);
(Continued)

(58) Field of Classification Search
USPC .............................................. 257/43, 59, 72
See application file for complete search history.

(56) References Cited

U.S. PATENT DOCUMENTS

| 8,927,330 B2* | 1/2015 | Zan | H01L 29/7869 |
| | | | 257/40 |
| 9,178,076 B2* | 11/2015 | Tsuruma | H01L 29/7869 |

(Continued)

FOREIGN PATENT DOCUMENTS

| JP | 5145513 B2 | 2/2013 |
| JP | 2013-254948 A | 12/2013 |
| JP | 2015-026831 A | 2/2015 |

OTHER PUBLICATIONS

Official Communication issued in International Patent Application No. PCT/JP2016/066477, dated Jul. 26, 2016.

*Primary Examiner* — Tan N Tran
(74) *Attorney, Agent, or Firm* — Keating & Bennett, LLP

(57) ABSTRACT

One of the upper surface and the lower surface of a semiconductor layer (7) of a thin-film transistor (101) in a semiconductor device (100) is in contact with a gate insulating layer (5), and the other is in contact with a first insulating layer (11) containing silicon oxide. The semiconductor layer (7) includes a first and second oxide semiconductor layers (7A, 7B). The first oxide semiconductor layer (7A) is arranged on a gate insulating layer side of the second oxide semiconductor layer (7B) and is in contact with the second oxide semiconductor layer. The second oxide semiconductor layer (7B) contains In and Ga and does not contain Sn. The first oxide semiconductor layer (7A) contains In, Sn, and Zn. The percentage of Zn in the first oxide semiconductor layer (7A) in the depth direction does not have a maximum value in the vicinity of a surface of the first oxide semiconductor layer adjacent to the second oxide semiconductor layer. The percentage of Sn having a metallic (Continued)

bonding state at the interface between the first oxide semiconductor layer and the second oxide semiconductor layer is 90% or less with respect to the total amount of Sn. A region where the percentage is 50% or more has a thickness of less than 10 nm.

19 Claims, 15 Drawing Sheets

(51) Int. Cl.
  *H01L 29/10* (2006.01)
  *H01L 29/24* (2006.01)
  *H01L 29/66* (2006.01)
(52) U.S. Cl.
  CPC ...... *H01L 29/66969* (2013.01); *H01L 29/786* (2013.01); *H01L 29/78696* (2013.01)

(56) References Cited

U.S. PATENT DOCUMENTS

| | | |
|---|---|---|
| 9,362,313 B2 * | 6/2016 | Morita .............. H01L 29/78606 |
| 2011/0260121 A1 | 10/2011 | Yano et al. |
| 2014/0374908 A1 | 12/2014 | Koezuka et al. |
| 2015/0091000 A1 | 4/2015 | Morita et al. |

* cited by examiner (a)

(b)

SEMICONDUCTOR DEVICE AND METHOD FOR PRODUCING THE SAME

TECHNICAL FIELD

The present invention relates to a semiconductor device composed of an oxide semiconductor.

BACKGROUND ART

Active matrix substrates used for liquid crystal display apparatuses and so forth include switching elements, such as thin-film transistors (hereinafter, referred to as "TFTs"), for respective pixels. It is reported that TFTs including an oxide semiconductor layer serving as an active layer (hereinafter, referred to as "oxide semiconductor TFTs") are used as the switching elements. As the oxide semiconductors, for example, In—Ga—Zn—O-based semiconductors are used.

An oxide semiconductor TFT includes a protective film (passivation film) formed by, for example, a plasma-enhanced chemical vapor deposition (CVD) method or a sputtering method on an oxide semiconductor layer in order to inhibit the degradation of TFT characteristics with time. As the protective film, for example, a silicon oxide ($SiO_2$) film is used.

An oxide semiconductor TFT containing an In—Sn—Zn—O-based semiconductor serving as an oxide semiconductor is disclosed (for example, PTL 1). In—Sn—Zn—O-based semiconductors can have higher mobilities than In—Ga—Zn—O-based semiconductors; thus, TFTs that operate at higher speed can be provided.

CITATION LIST

Patent Literature

PTL 1: Japanese Patent No. 5145513

SUMMARY OF INVENTION

Technical Problem

Studies by the inventors indicated that when an oxide semiconductor TFT including an active layer composed of an In—Sn—Zn—O-based semiconductor is produced, desired TFT characteristics are not obtained, in some cases.

Further studies of factors thereof by the inventors indicated that the concentration of oxygen is reduced at the interface between an In—Sn—Zn—O-based semiconductor and a silicon oxide film serving as a protective film. The results of the studies by the inventors will be described in detail below. Thus, it seems that oxygen deficiency occurs in the In—Sn—Zn—O-based semiconductor layer to increase the carrier concentration and the defect level of the active layer, thereby reducing the resistance to cause the threshold voltage to shift in a negative direction. This can result in a normally on (depletion) type, in which a drain current flows when a gate voltage is not applied; thus, the TFT can be difficult to operate as a switching device.

An embodiment of the present invention has been accomplished in light of the foregoing circumstances. It is an object thereof to provide a semiconductor device including a TFT that can be operated at high speed and that has stable characteristics.

Solution to Problem

A semiconductor device according to an embodiment of the present invention includes a substrate, a thin-film transistor supported on the substrate, and a first insulating layer, the thin-film transistor including a semiconductor layer, a gate electrode, a gate insulating layer arranged between the gate electrode and the semiconductor layer, a source electrode, and a drain electrode, the source electrode and the drain electrode being in contact with the semiconductor layer, in which one of the upper surface and the lower surface of the semiconductor layer is in contact with the gate insulating layer, the other is in contact with the first insulating layer, the semiconductor layer has a laminated structure including a first oxide semiconductor layer and a second oxide semiconductor layer, the first oxide semiconductor layer is arranged on a gate insulating layer side of the second oxide semiconductor layer and is in contact with the second oxide semiconductor layer, the first insulating layer contains silicon oxide, the second oxide semiconductor layer contains In and Ga and does not contain Sn, the first oxide semiconductor layer contains In, Sn, and Zn, the percentage of Zn in the first oxide semiconductor layer in the depth direction does not have a maximum value in the vicinity of a surface of the first oxide semiconductor layer adjacent to the second oxide semiconductor layer, the percentage of Sn having a metallic bonding state at the interface between the first oxide semiconductor layer and the second oxide semiconductor layer is 90% or less with respect to the total amount of Sn, and a region where the percentage of Sn having the metallic bonding state at the interface between the first oxide semiconductor layer and the second oxide semiconductor layer is 50% or more with respect to the total amount of Sn has a thickness of less than 10 nm.

In an embodiment, the percentage of Sn having the metallic bonding state at the interface between the first oxide semiconductor layer and the second oxide semiconductor layer is 40% or less with respect to the total amount of Sn.

In an embodiment, the composition ratio of Ga contained in the second oxide semiconductor layer is higher than the composition ratio of In.

In an embodiment, the first oxide semiconductor layer is in contact with the gate insulating layer, and the percentage of Zn having a metallic bonding state at the interface between the first oxide semiconductor layer and the gate insulating layer is 50% or less with respect to the total amount of Zn.

In an embodiment, the percentage of In having a metallic bonding state in the second oxide semiconductor layer is 10% or more with respect to the total amount of In, and the percentage of In having the metallic bonding state in the first oxide semiconductor layer is less than 10% with respect to the total amount of In.

In an embodiment, the second oxide semiconductor layer is in contact with the first insulating layer, and the percentage of oxygen in the second oxide semiconductor layer in the depth direction does not have a minimum value in the vicinity of a surface of the second oxide semiconductor layer adjacent to the first insulating layer.

In an embodiment, the first oxide semiconductor layer contains an In—Sn—Zn—O-based semiconductor.

In an embodiment, the second oxide semiconductor layer contains an In—Ga—Zn—O-based semiconductor.

In an embodiment, the second oxide semiconductor layer contains an In—Ga—O-based semiconductor.

In an embodiment, the second oxide semiconductor layer contains a crystalline portion.

In an embodiment, the first oxide semiconductor layer is in contact with the gate insulating layer, and the second oxide semiconductor layer is in contact with the first insulating layer.

In an embodiment, the gate electrode is arranged between the semiconductor layer and the substrate, each of the source electrode and the drain electrode is in contact with part of the upper surface of the semiconductor layer, and the first insulating layer is a protective film covering the thin-film transistor and is in contact with a portion of the upper surface of the semiconductor layer located between the source electrode and the drain electrode.

In an embodiment, the gate electrode is arranged between the semiconductor layer and the substrate, each of the source electrode and the drain electrode is in contact with part of the upper surface of the semiconductor layer, and the first insulating layer is arranged between the semiconductor layer and the source electrode and the drain electrode, and the first insulating layer is in contact with a portion of the upper surface of the semiconductor layer located between the source electrode and the drain electrode.

In an embodiment, the semiconductor device further includes a third oxide semiconductor layer between the first oxide semiconductor layer and the gate insulating layer, in which the third oxide semiconductor layer contains In and Ga and does not contain Sn.

A method for producing a semiconductor device according to an embodiment of the present invention includes the steps of (A) forming a gate electrode and a gate insulating layer covering the gate electrode on a substrate, (B) forming a semiconductor layer having a laminated structure on the gate insulating layer, the semiconductor layer including a first oxide semiconductor layer and a second oxide semiconductor layer, the step (B) including the substeps of forming the first oxide semiconductor layer containing In, Sn, and Zn, and forming the second oxide semiconductor layer that contains In and Ga and that does not contain Sn so as to be in contact with an upper surface of the first oxide semiconductor layer, (C) forming a source electrode and a drain electrode in contact with the semiconductor layer to provide a thin-film transistor, and (D) forming a first insulating layer containing silicon oxide so as to cover the thin-film transistor, in which after the step (D), the method further includes a step of subjecting the substrate including the semiconductor layer to annealing treatment at a temperature of 300° C. or lower.

In an embodiment, the composition ratio of Ga contained in the second oxide semiconductor layer is higher than the composition ratio of In.

In an embodiment, the percentage profile of Zn in the first oxide semiconductor layer in the depth direction does not have a maximum value in the vicinity of a surface of the first oxide semiconductor layer adjacent to the second oxide semiconductor layer, and the percentage of Sn having a metallic bonding state at the interface between the first oxide semiconductor layer and the second oxide semiconductor layer is 90% or less with respect to the total amount of Sn.

In an embodiment, the first oxide semiconductor layer contains an In—Sn—Zn—O-based semiconductor.

In an embodiment, the second oxide semiconductor layer contains an In—Ga—Zn—O-based semiconductor.

In an embodiment, the second oxide semiconductor layer contains a crystalline portion.

Advantageous Effects of Invention

According to an embodiment of the present invention, it is possible to provide the semiconductor device including the TFT that can be operated at high speed and that has stable characteristics.

DESCRIPTION OF EMBODIMENTS

Findings from studies by the inventors will now be described.

As described above, an oxide semiconductor TFT including an In—Sn—Zn—O-based semiconductor layer serving as an active layer (hereinafter, referred to as an "In—Sn—Zn—O-based semiconductor TFT") does not have desired TFT characteristics, in some cases. To determine its cause, the inventors produced the In—Sn—Zn—O-based semiconductor TFT and a TFT including an In—Ga—Zn—O-based semiconductor layer (hereinafter, referred to as an "In—Ga—Zn—O-based semiconductor TFT"), and concentration profiles in the semiconductor layer of each of the TFTs in the thickness direction were measured by Auger electron spectroscopy.

Figure 11:
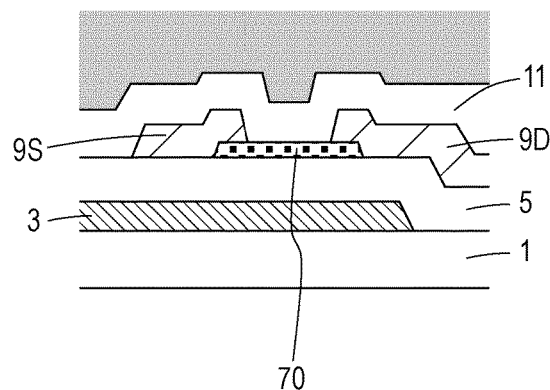
FIG. 11(a) is a cross-sectional view illustrating the structure of a conventional TFT 10 including a single semiconductor layer, and (b) and (c) illustrate the profiles of the elements of an In—Ga—Zn—O-based semiconductor layer and an In—Sn—Zn—O-based semiconductor layer, respectively, in the depth direction.
Figure 11:
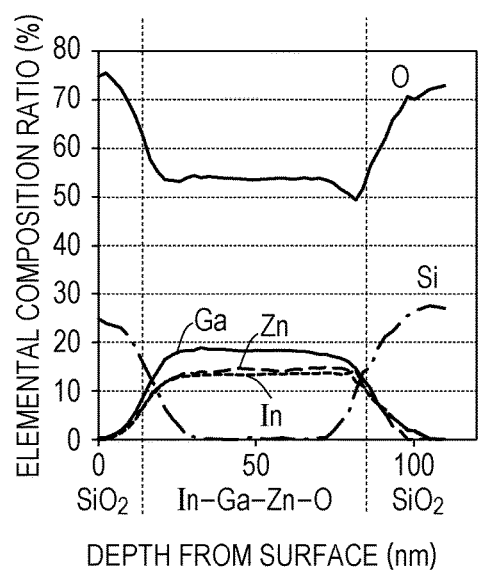
Figure 11:
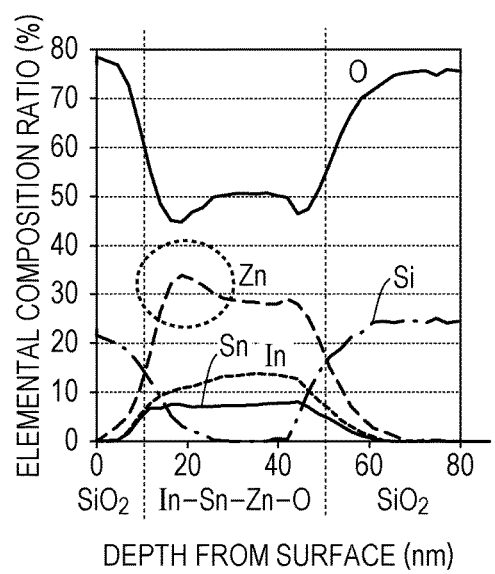

FIG. 11(a) is a cross-sectional view illustrating the structure of a conventional TFT 10 used for the analysis of the concentration profiles. The TFT 10 illustrated in FIG. 11(a) is a bottom gate-type TFT having a channel-etched structure. The TFT 10 includes a substrate 1, a gate electrode 3 arranged on the substrate 1, a semiconductor layer 70 on the gate electrode 3 with a gate insulating layer ($SiO_2$) 5 provided therebetween, and source-drain electrodes 9. The source-drain electrodes 9 are arranged so as to be in contact with the upper surface of the semiconductor layer 70. The TFT 10 is covered with a protective film ($SiO_2$) 11. The protective film 11 is arranged so as to be in contact with the channel region of the semiconductor layer 70 and the source-drain electrodes 9. The semiconductor layer 70 has been subjected to oxidation treatment in order to stabilize the characteristics. Here, $N_2O$ plasma treatment serving as the oxidation treatment was performed at 200° C. after the formation of the semiconductor layer 70 and before the formation of the protective film 11. Furthermore, annealing treatment was performed at 250° C. or higher after the formation of the protective film 11.

FIG. 11(b) illustrates an example of the concentration profiles of indium (In), gallium (Ga), zinc (Zn), oxygen (O), and silicon (Si) in a semiconductor layer 70 in the thickness direction d, the semiconductor layer 70 being included in an In—Ga—Zn—O-based semiconductor TFT. Here, as the In—Ga—Zn—O-based semiconductor, a semiconductor in which the ratio of In to Ga to Zn was 1:3:6 was used.

FIG. 11(c) illustrates an example of the concentration profiles of indium (In), tin (Sn), zinc (Zn), oxygen (O), and silicon (Si) in a semiconductor layer 70 in the thickness direction, the semiconductor layer 70 being included in an In—Sn—Zn—O-based semiconductor TFT. As the In—Sn—Zn—O-based semiconductor, for example, a semiconductor in which In:Sn:Zn is about 2:1:4 was used.

As illustrated in FIGS. 11(b) and 11(c), the percentage of oxygen atoms present in $SiO_2$ is about 80%, the percentage (proportion) of oxygen atoms present in the middle of the In—Ga—Zn—O-based semiconductor layer in the thickness direction d is about 55%, and the percentage of oxygen atoms present in the middle of the In—Sn—Zn—O-based semiconductor layer in the thickness direction is about 50%.

As illustrated in FIGS. 11(b) and 11(c), in any of the TFTs, there is a region having a lower oxygen concentration than the inside of the semiconductor layer 70 at the interface between the semiconductor layer 70 and the gate insulating layer 5. The region functions virtually as a channel having a high carrier concentration.

When we focus attention on the constituent ratio of elements at the interface (back channel side) between the semiconductor layer 70 and the protective film 11, the ratio of Zn in the In—Sn—Zn—O-based semiconductor TFT is increased at the interface between the semiconductor layer 70 and the protective film 11 as illustrated in FIG. 11(c). This indicates the aggregation of Zn. Furthermore, the figure indicates that the percentage of oxygen atoms (oxygen concentration) is significantly reduced with increasing ratio of Zn. This phenomenon rarely occurs in the In—Ga—Zn—O-based semiconductor TFT (FIG. 11(b)).

A local region having a low oxygen concentration can also be formed in a portion of the In—Ga—Zn—O-based semiconductor layer in the vicinity of its upper surface immediately after the formation of the protective film as described below. The subsequent annealing treatment is performed to oxidize the semiconductor layer, thereby eliminating the region having a low oxygen concentration. However, in the case where the In—Sn—Zn—O-based semiconductor layer is used as the oxide semiconductor layer, even if the annealing treatment is performed after the formation of the protective film, a region having a low oxygen concentration (or a region having a high percentage of Zn) is left as illustrated in FIG. 11(c).

As described above, in the In—Sn—Zn—O-based semiconductor TFT, the oxygen concentration has a minimum value in the vicinity of a surface of the semiconductor layer 70 adjacent to the protective film 11 (back channel side). This indicates the presence of a region having a low oxygen concentration. In this example, a region having an oxygen concentration lower than a region functioning as a channel is formed on the back channel side. When the region having a low oxygen concentration is formed on the back channel side, this region also functions as a channel. This can lead to an increase in leakage current, thus possibly failing to provide desired TFT characteristics. Furthermore, even when a negative bias is applied as a gate voltage, the channel cannot be off (depletion), in some cases.

In the In—Sn—Zn—O-based semiconductor TFT (FIG. 11(c)), the aggregation of Zn and a decrease in oxygen concentration occur on the back channel side of the semiconductor layer 70. The reason this phenomenon does not occur in the In—Ga—Zn—O-based semiconductor TFT (FIG. 11(b)) seems to be as follows.

Figure 12:
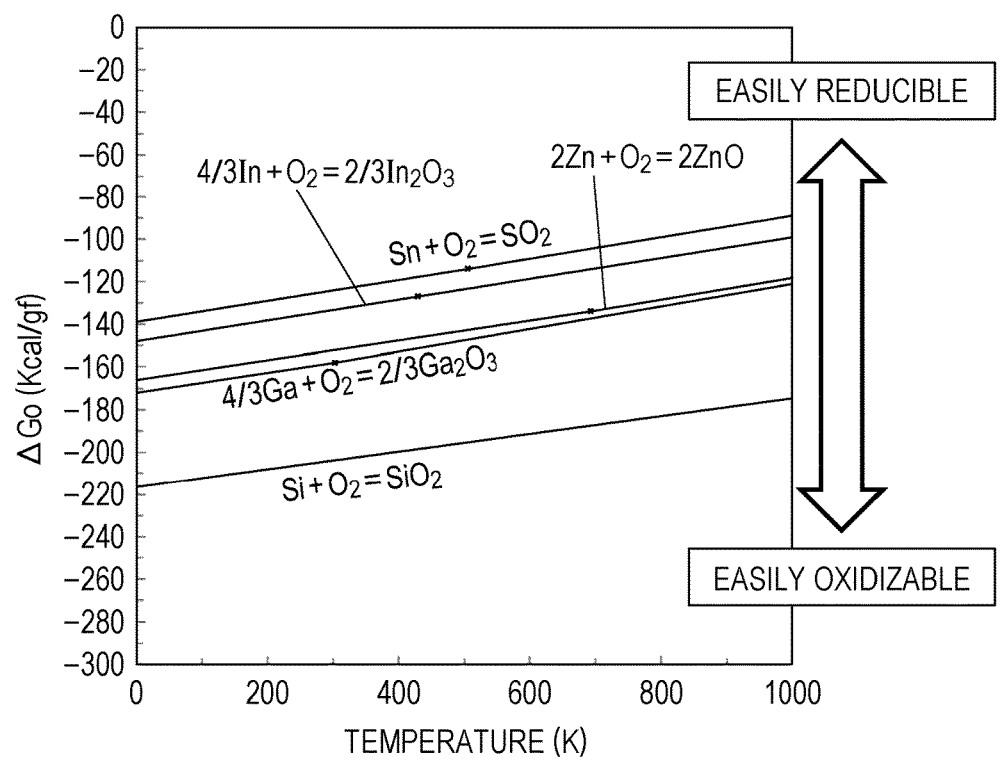
FIG. 12 is an Ellingham diagram illustrating the dependence of the standard Gibbs energy of formation of the oxides of Si, Ga, Sn, and In on temperature.

FIG. 12 is an Ellingham diagram illustrating the dependence of the standard Gibbs energies of formation of the oxides of Si, Ga, Sn, and In on temperature. In FIG. 12, the vertical axis represents the Gibbs free energy $\Delta Go$, and the horizontal axis represents absolute temperature. This figure indicates that a material plotted on the lower side is more easily oxidizable and that a material plotted on the higher side is more easily reducible. FIG. 12 clearly indicates that Si is more easily oxidizable than metal elements contained in the In—Sn—Zn—O-based semiconductor and the In—

Ga—Zn—O-based semiconductor. It is also indicated that Ga and Zn are relatively easily oxidizable metals and that Sn is an easily reducible metal. In the In—Ga—Zn—O-based semiconductor TFT (FIG. 11(b)), Si dangling bonds in SiO$_2$ can deprive oxygen from the In—Ga—Zn—O-based semiconductor and can be bonded to the oxygen at the interface at which the In—Ga—Zn—O-based semiconductor is in contact with SiO$_2$. However, as illustrated in FIG. 12, the In—Ga—Zn—O-based semiconductor contains Ga and Zn, which are easily oxidizable; thus, the In—Ga—Zn—O-based semiconductor exhibits relatively stable material properties even when in contact with SiO$_2$. By increasing the Ga content, the stability of the In—Ga—Zn—O-based semiconductor can be further improved. In contrast, in the In—Sn—Zn—O-based semiconductor TFT (FIG. 11(c)), the In—Sn—Zn—O-based semiconductor contains Sn, which is easily reducible, in place of Ga, and is easily reduced by contact with SiO$_2$. Thus, in the In—Sn—Zn—O-based semiconductor TFT, metals such as Zn and Sn are liable to be precipitated by reduction at the interface between the protective film 11 and the semiconductor layer 70, compared with the In—Ga—Zn—O-based semiconductor TFT. The oxygen concentration seems to be decreased by the reduction of the metals to increase the carrier concentration.

In the semiconductor layer 70 of the In—Sn—Zn—O-based semiconductor TFT, the upper surface and the lower surface of the semiconductor layer 70 are in contact with the SiO$_2$ layers, the aggregation of Zn occurs in the vicinities of the interfaces thereof. The aggregation of Zn on the upper surface of the semiconductor layer 70 (the surface on the back channel side) is greater than that on the lower surface. The reason for this is presumably that when the protective film is formed on the semiconductor layer 70, the upper surface of the semiconductor layer 70 is more susceptible to damage than the lower surface; thus, a higher degree of oxygen deficiency can be obtained on the upper surface.

The inventors have conducted studies on a TFT structure that can inhibit the aggregation of Zn on a portion of an In—Sn—Zn—O-based semiconductor layer on the back channel side and have found that the aggregation of Zn can be inhibited by arranging an In—Ga—Zn—O-based semiconductor layer between the In—Sn—Zn—O-based semiconductor layer and a protective film.

Figure 13:
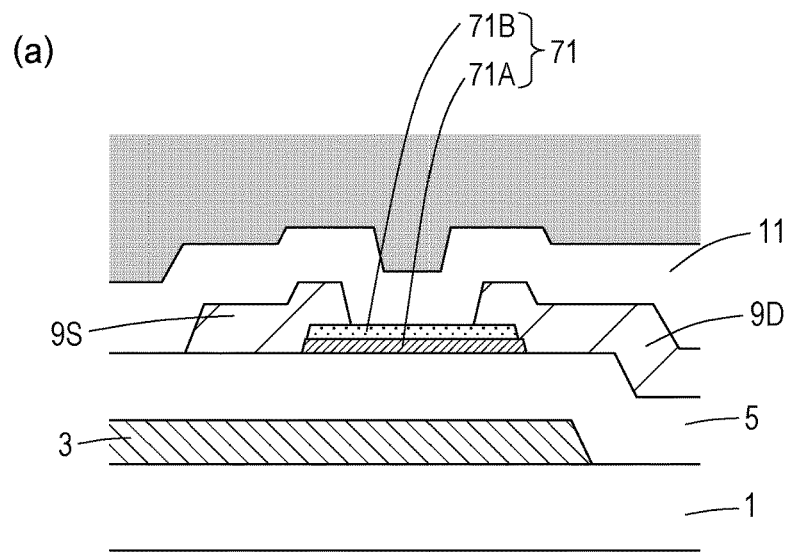
FIG. 13(a) is a cross-sectional view illustrating the structure of a TFT 20 including a semiconductor layer stack, and (b) illustrates the profiles of elements in the TFT 20 in the depth direction.
Figure 13:
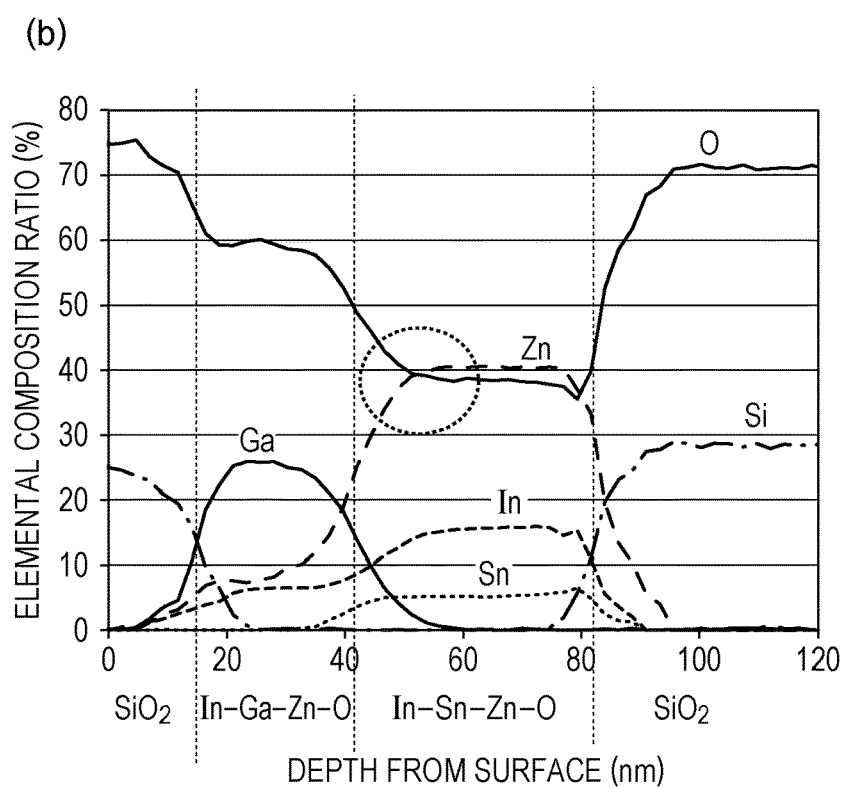

FIG. 13(a) is a schematic cross-sectional view illustrating the structure of a TFT 20 used for analysis by the inventors. In FIG. 13(a), elements similar to those illustrated in FIG. 11(a) are designated by like reference numerals. The TFT 20 includes a semiconductor layer stack 71 including an In—Sn—Zn—O-based semiconductor layer 71A and an In—Ga—Zn—O-based semiconductor layer 71B stacked in this order. The compositions of the In—Sn—Zn—O-based semiconductor and the In—Ga—Zn—O-based semiconductor are identical to those of the semiconductors of the TFTs illustrated in FIGS. 11(b) and 11(c).

FIG. 13(b) illustrates the results of the percentages of elements present in the semiconductor layer stack 71 of the oxide semiconductor TFT 20 by analysis using Auger electron spectroscopy. In FIG. 13(b), the horizontal axis represents depth from the surface of the protective film 11, and the vertical axis represents the percentages of the elements present.

The results illustrated in FIG. 13(b) indicate that the arrangement of the In—Ga—Zn—O-based semiconductor layer 71B between the In—Sn—Zn—O-based semiconductor layer 71A and the protective film 11 inhibits the aggregation of Zn occurring on the upper surface side of the In—Sn—Zn—O-based semiconductor layer 71A to inhibit the decrease in oxygen concentration. In this example, the oxygen concentration on the upper surface side of the In—Sn—Zn—O-based semiconductor layer 71A can be higher than the oxygen concentration in a region located in the vicinity of the interface with the gate insulating layer 5 (the region serving as a channel).

The percentage of Zn in the In—Sn—Zn—O-based semiconductor layer 71A does not have a maximum value in the vicinity of its surface on the back channel side, i.e., in the vicinity of the boundary with the In—Ga—Zn—O-based semiconductor layer 71B. Furthermore, the percentage of Zn in the vicinity of the boundary with the In—Ga—Zn—O-based semiconductor layer 71B is comparable to or less than the percentage of Zn in the middle portion of the In—Sn—Zn—O-based semiconductor layer 71A in the thickness direction (for example, 105% or less of the percentage of Zn in the middle portion).

However, the inventors have conducted further studies and have found that even if the semiconductor layer stack 71 as described above is used, good TFT characteristics are not obtained, in some cases. There seems to be a factor causing characteristic degradation in addition to the aggregation of Zn described above.

The inventors have conducted further detailed studies of the relationship between the structure of the semiconductor layer and the TFT characteristics on the basis of the foregoing finding. The results of the studies will be described below. Thus, the inventors have found a TFT structure that can stably provide desired TFT characteristics and have conceived the present invention.

First Embodiment

A semiconductor device according to a first embodiment of the present invention will be described below by taking an active matrix substrate as an example with reference to the drawings. The semiconductor device of this embodiment may include an oxide semiconductor TFT. Examples of the semiconductor device widely include active matrix substrates, various display apparatuses, and electronic apparatuses.

FIGS. 1(a) and 1(b) are a schematic cross-sectional view and a schematic plan view, respectively, of a semiconductor device 100 according to this embodiment. FIG. 1(a) is a cross-sectional view taken along line I-I' of FIG. 1(b). FIG. 1(c) is an enlarged cross-sectional view of a semiconductor layer 7 of the TFT 10.

The semiconductor device 100 includes a substrate 1, TFTs 101, a protective film 11 that covers the TFTs 101, and an interlayer insulating layer 13.

The TFTs 101 are, for example, channel-etched-type TFTs. Each of the TFTs 101 includes a gate electrode 3 supported on the substrate 1, a gate insulating layer 5 covering the gate electrode 3, a semiconductor layer 7 arranged so as to overlap the gate electrode 3 with the gate insulating layer 5 provided therebetween, a source electrode 9S, and a drain electrode 9D. Each of the source electrode 9S and the drain electrode 9D are arranged so as to be in contact with the upper surface of the semiconductor layer 7.

The semiconductor layer 7 according to this embodiment has a laminated structure including a first oxide semiconductor layer 7A and a second oxide semiconductor layer 7B as illustrated in FIG. 1(c). The first oxide semiconductor layer 7A is arranged on the gate insulating layer 5 side of the second oxide semiconductor layer 7B and is in contact with the second oxide semiconductor layer 7B. In this example, the second oxide semiconductor layer 7B is arranged so as to be in contact with the upper surface of the first oxide semiconductor layer 7A. The second oxide semiconductor layer 7B is the uppermost layer of the semiconductor layer 7 and may constitute the upper surface of the semiconductor layer 7. The first oxide semiconductor layer 7A is the lowermost layer of the semiconductor layer 7 and may be in contact with the gate insulating layer 5.

The first oxide semiconductor layer 7A contains In, Sn, and Zn. The second oxide semiconductor layer 7B contains In and Ga and does not contain Sn. The first oxide semiconductor layer 7A may be formed of, for example, an In—Sn—Zn—O-based semiconductor layer or an In—Al—Sn—Zn—O-based semiconductor layer. The second oxide semiconductor layer 7B may be formed of, for example, an In—Ga—Zn—O-based semiconductor layer or an In—Ga—O-based semiconductor layer. The semiconductor material of the first oxide semiconductor layer 7A contains In, Sn, and Zn and can have a high mobility as described in the prior art. The second oxide semiconductor layer 7B does not contain Sn, which is easily reducible, and thus can inhibit a decrease in oxygen concentration due to the reduction of a metal contained in the semiconductor layer 7.

In this embodiment, the percentage of Zn in the first oxide semiconductor layer 7A in the depth direction does not have a maximum value in the vicinity of its surface adjacent to the second oxide semiconductor layer 7B. The percentage of metallic Sn at the interface between the first oxide semiconductor layer 7A and the second oxide semiconductor layer 7B is 0% or more and 90% or less with respect to the total amount of Sn. The "metallic Sn" refers to Sn having a metallic bonding state. For example, the metallic Sn can be formed by the reduction of Sn contained in an oxide. The "percentage of metallic Sn with respect to the total amount of Sn" refers to the percentage of metallic Sn with respect to the total amount of metallic Sn and Sn contained in the oxide (Sn having an oxide bonding state).

The semiconductor layer 7 includes a channel region and a source contact region and a drain contact region that are located on both sides of the channel region. The source electrode 9S is formed so as to be in contact with the source contact region. The drain electrode 9D is formed so as to be in contact with the drain contact region. The source electrode 9S is electrically connected to a source line S. The drain electrode 9D is electrically connected to a transparent conductive layer 19. In this specification, the "channel region" refers to a region including a portion of the semiconductor layer 7 where a channel is formed when viewed from the normal direction of the substrate 1. As described above, in this embodiment, a channel can be formed in a portion of the channel region of the first oxide semiconductor layer 7A in the vicinity of the gate insulating layer 5.

The TFT 101 is covered with the protective film 11 that is a passivation film. The protective film 11 may be arranged so as to be in contact with the channel region of the semiconductor layer 7. The TFT 101 has a channel-etched structure in this example; however, when the TFT 101 has an etch stop structure, the channel region of the semiconductor layer 7 is covered with an etch stop layer. The protective film 11 or the etch stop layer may be an insulating film, such as an oxide film, containing oxygen and is, for example, a $SiO_2$ film.

The interlayer insulating layer 13 is arranged on the protective film 11. The interlayer insulating layer 13 may be formed of an organic insulating layer. A contact hole CH is formed through the protective film 11 and the interlayer insulating layer 13 to a surface of the drain electrode 9D.

The semiconductor device 100 may further include a transparent conductive layer 19 electrically connected to the TFT 101. The transparent conductive layer 19 functions as, for example, a pixel electrode. In this example, the transparent conductive layer 19 is arranged on the interlayer insulating layer 13 and in the contact hole CH. The transparent conductive layer 19 is in direct contact with the drain electrode 9D in the contact hole CH.

In the TFT 101 according to this embodiment, the aggregation of Zn occurring on the back channel side of the first oxide semiconductor layer 7A of the semiconductor layer 7 is inhibited. The percentage of metallic Sn at the interface between the first oxide semiconductor layer 7A and the second oxide semiconductor layer 7B is 90% or less with respect to the total Sn. This inhibits a decrease in oxygen concentration in the semiconductor layer 7 due to the reduction of a metal at the interface between the first oxide semiconductor layer 7A and the second oxide semiconductor layer 7B. Thus, an increase in carrier concentration on the back channel side of the first oxide semiconductor layer 7A in the vicinity of its surface can be inhibited, providing stable TFT characteristics.

The percentage of metallic Sn at the interface between the first oxide semiconductor layer 7A and the second oxide semiconductor layer 7B is preferably 40% or less with respect to the total Sn. In this case, a decrease in oxygen concentration due to the reduction of Sn can be effectively inhibited, providing further stable TFT characteristics.

The composition of an oxide semiconductor contained in the second oxide semiconductor layer 7B is not particularly limited. The composition ratio of Ga in the oxide semiconductor may be larger than the composition ratio of In, or the composition ratio of Zn in the oxide semiconductor may be larger than the composition ratio of In. When the content of Ga and/or Zn, which are relatively less likely to be reduced, is higher than the content of In, which is relatively easily reducible, the occurrence of oxygen deficiency due to the reduction of a metal can be further effectively inhibited.

Figure 2:
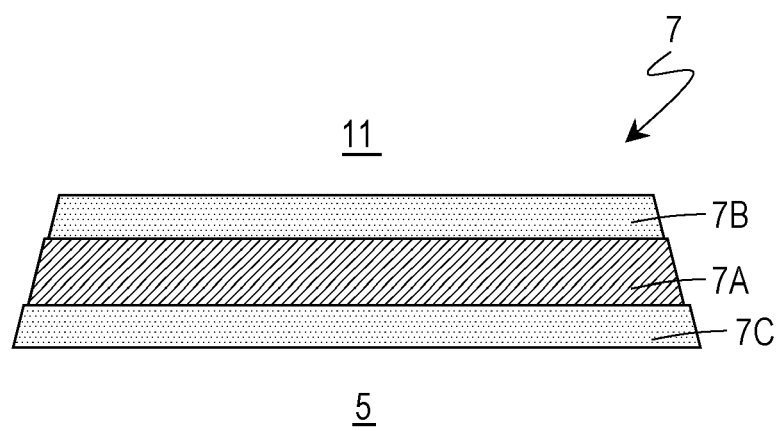
FIG. 2 is a schematic cross-sectional view of another example of the semiconductor layer 7 according to the first embodiment.
Figure 3:
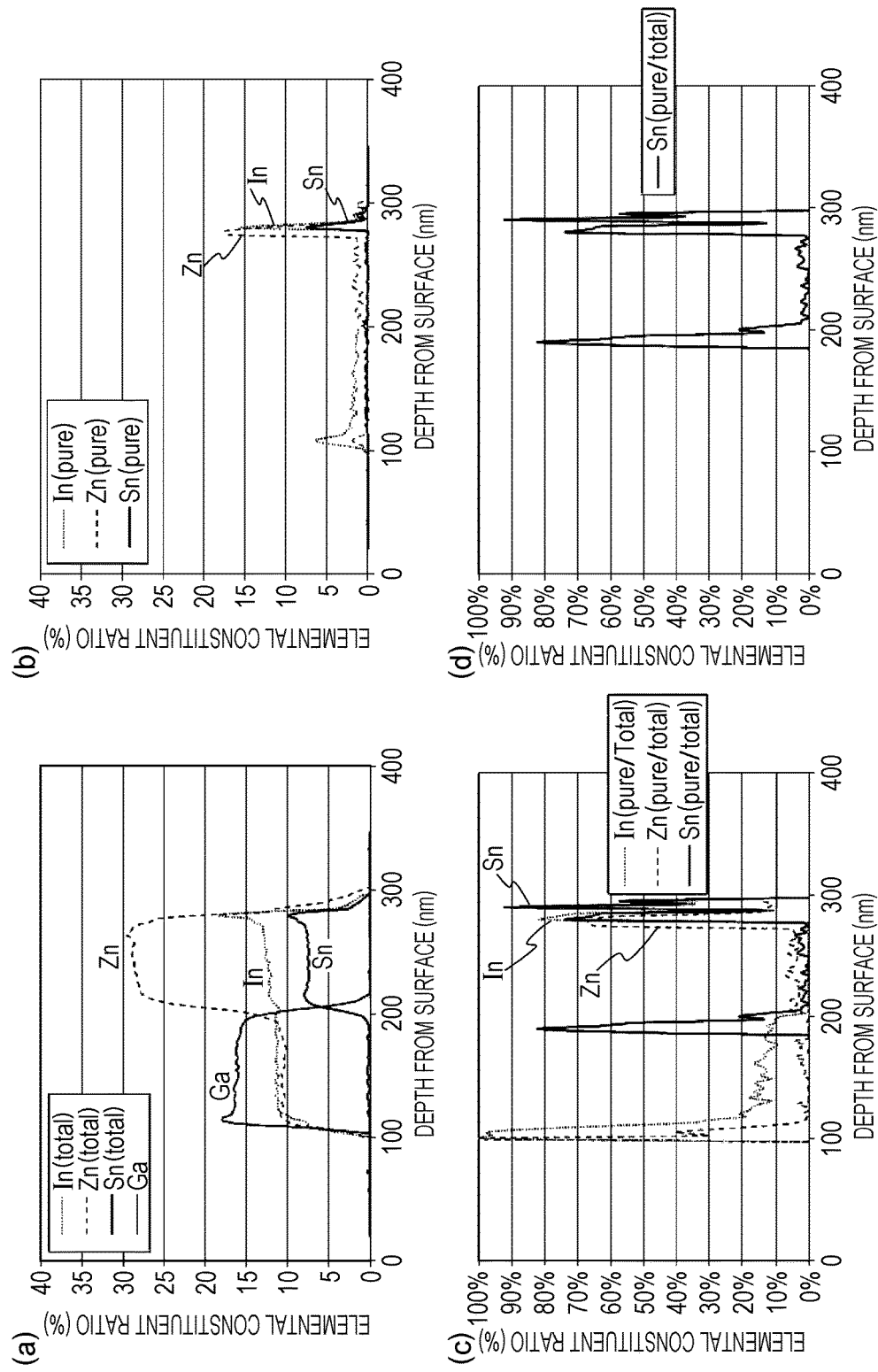
FIG. 3(a) illustrates the constituent ratio of elements in sample 1 in the depth direction, (b) illustrates the constituent ratio of metals in pure states, (c) illustrates the ratio of the amount of each of the metals in the pure states to the total amount a corresponding one of the metals, and (d) illustrates the ratio of the amount of Sn in the pure state to the total amount of Sn.
Figure 4:
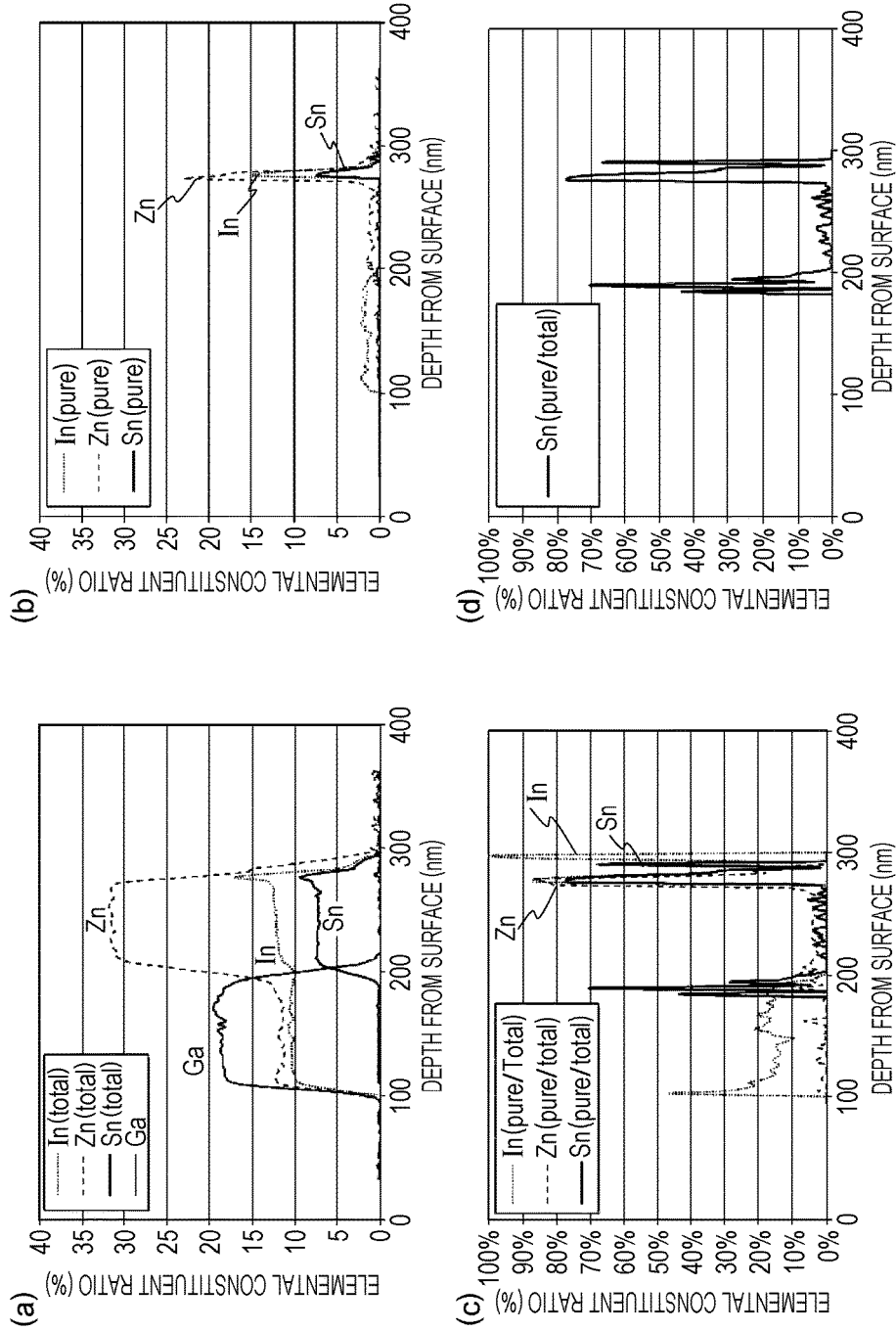
FIG. 4(a) illustrates the constituent ratio of elements in sample 2 in the depth direction, (b) illustrates the constituent ratio of metals in pure states, (c) illustrates the ratio of the amount of each of the metals in the pure states to the total amount a corresponding one of the metals, and (d) illustrates the ratio of the amount of Sn in the pure state to the total amount of Sn.
Figure 5:
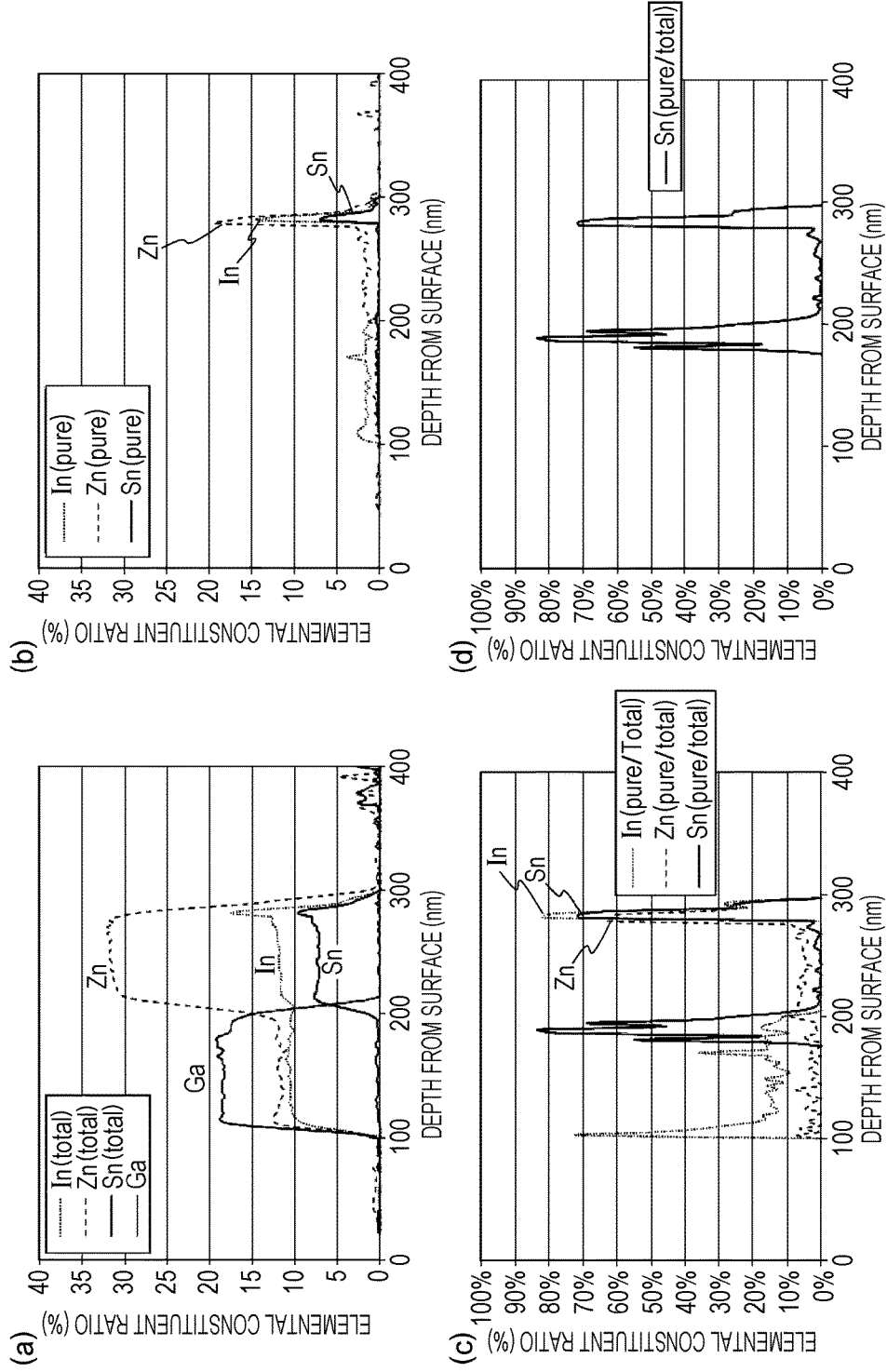
FIG. 5(a) illustrates the constituent ratio of elements in sample 3 in the depth direction, (b) illustrates the constituent ratio of metals in pure states, (c) illustrates the ratio of the amount of each of the metals in the pure states to the total amount a corresponding one of the metals, and (d) illustrates the ratio of the amount of Sn in the pure state to the total amount of Sn.
Figure 6:
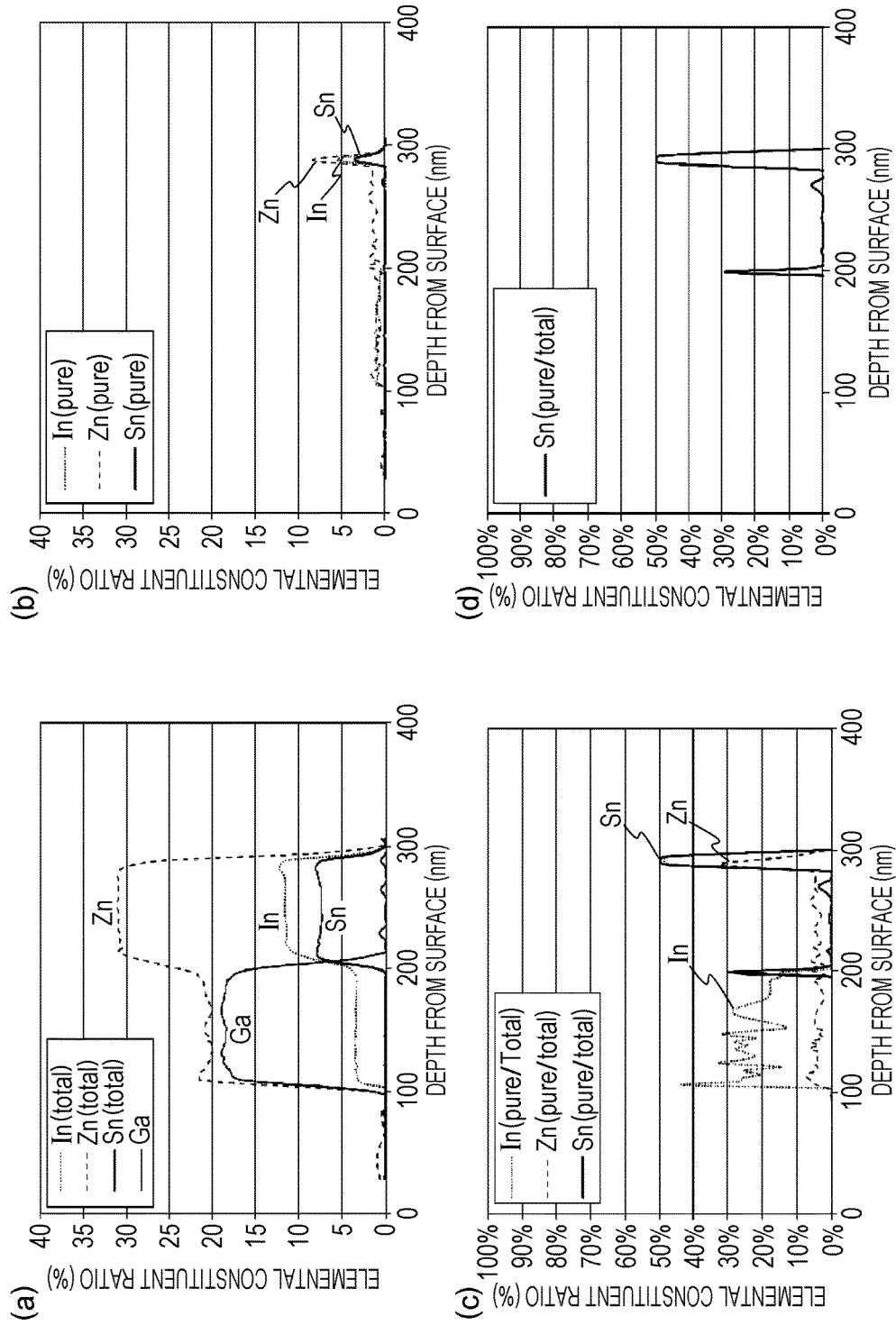
FIG. 6(a) illustrates the constituent ratio of elements in sample 4 in the depth direction, (b) illustrates the constituent ratio of metals in pure states, (c) illustrates the ratio of the amount of each of the metals in the pure states to the total amount a corresponding one of the metals, and (d) illustrates the ratio of the amount of Sn in the pure state to the total amount of Sn.
Figure 7:
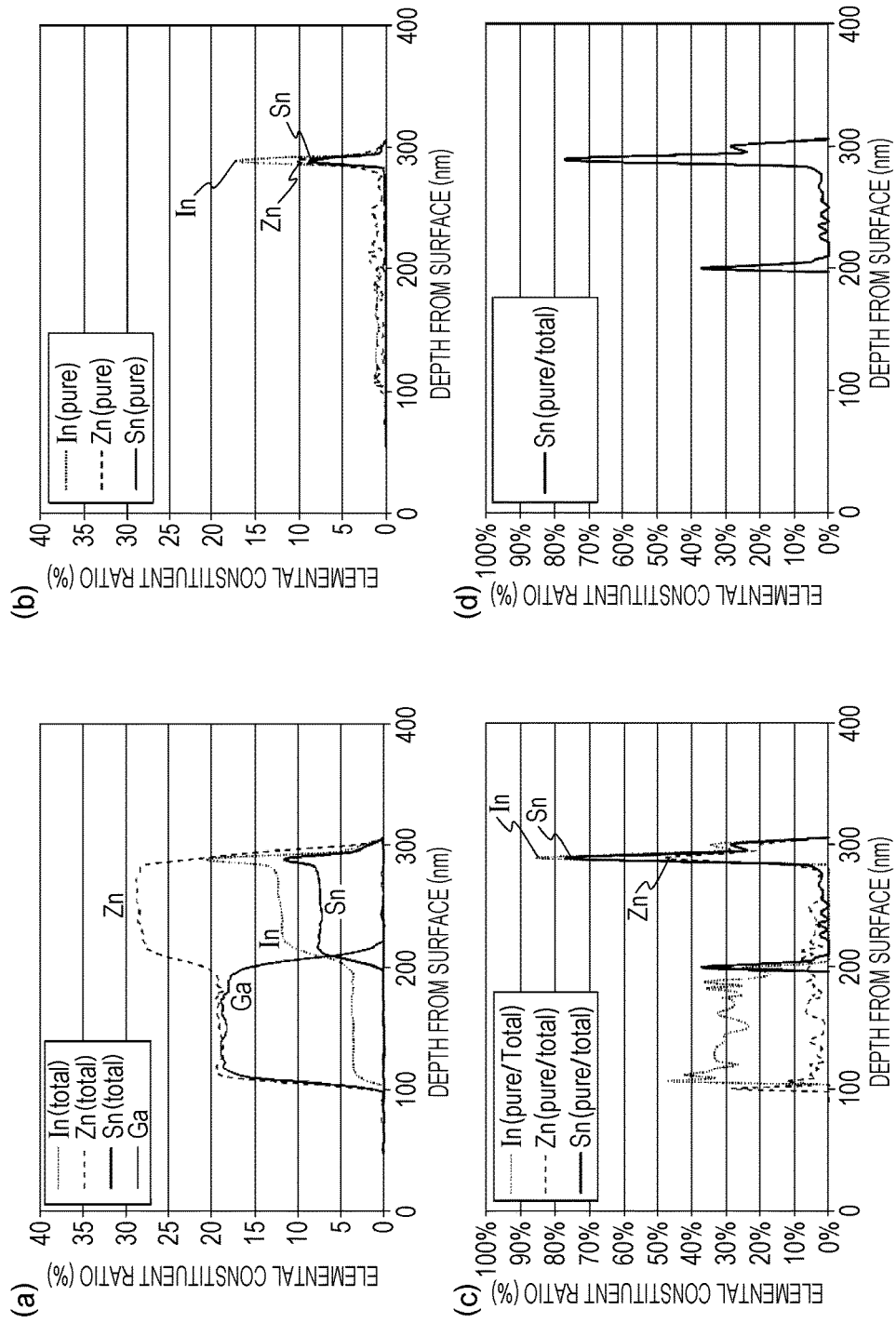
FIG. 7(a) illustrates the constituent ratio of elements in sample 5 in the depth direction, (b) illustrates the constituent ratio of metals in pure states, (c) illustrates the ratio of the amount of each of the metals in the pure states to the total amount a corresponding one of the metals, and (d) illustrates the ratio of the amount of Sn in the pure state to the total amount of Sn.
Figure 8:
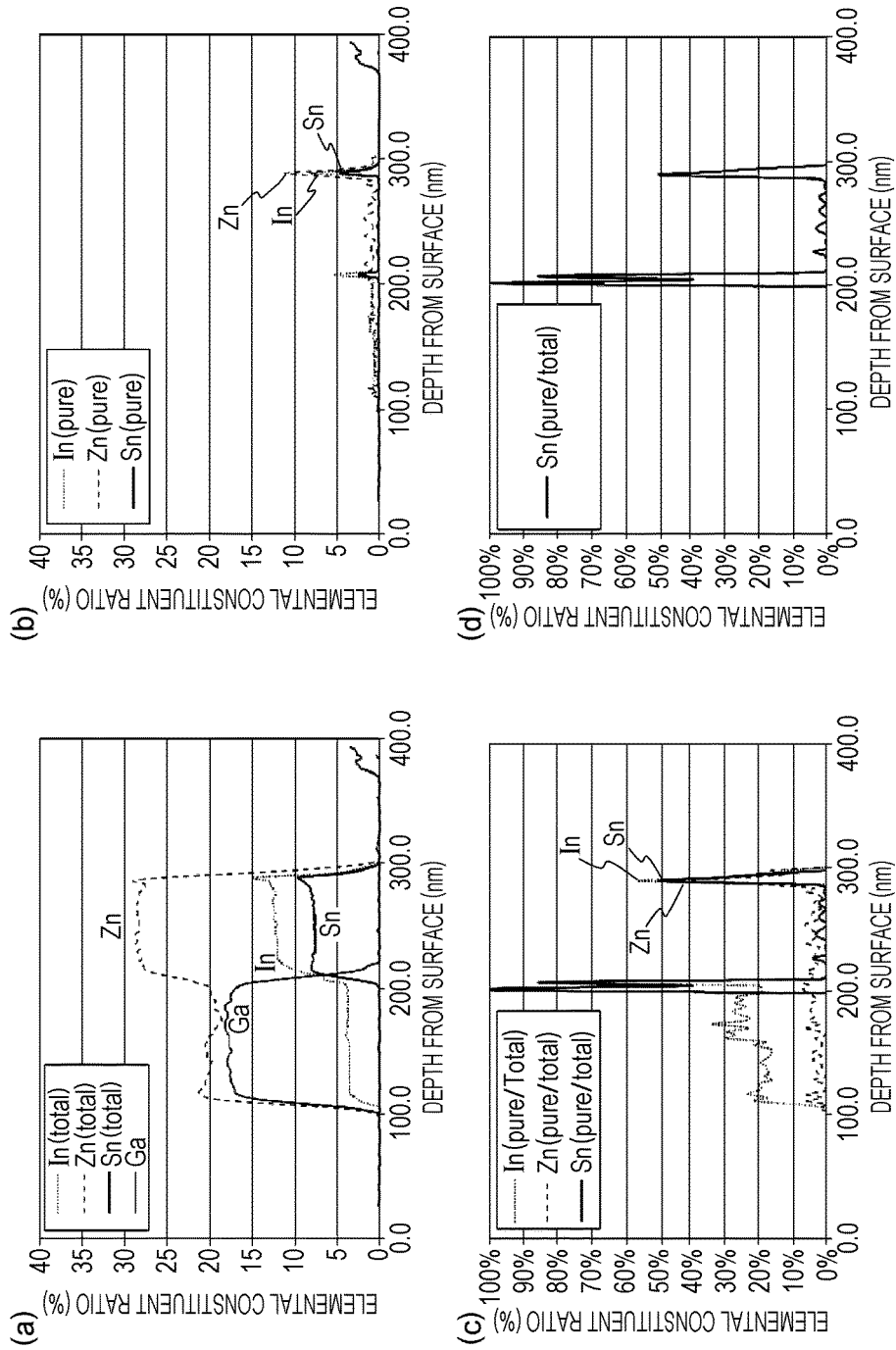
FIG. 8(a) illustrates the constituent ratio of elements in sample 6 in the depth direction, (b) illustrates the constituent ratio of metals in pure states, (c) illustrates the ratio of the amount of each of the metals in the pure states to the total amount a corresponding one of the metals, and (d) illustrates the ratio of the amount of Sn in the pure state to the total amount of Sn.

The semiconductor layer 7 according to this embodiment is not limited to the exemplified two-layer structure and may have a laminated structure including three or more layers that include the first oxide semiconductor layer 7A and the second oxide semiconductor layer 7B. For example, as illustrated in FIG. 2, a third oxide semiconductor layer 7C that contains In and Ga and that does not contain Sn may be further included on the gate insulating layer 5 side of the first oxide semiconductor layer 7A. In this case, the reduction of Zn, Sn, and In can be inhibited even at the interface between the first oxide semiconductor layer 7A and the gate insulating layer 5; hence, the characteristic degradation due to the increase of oxygen deficiency can be inhibited. Thus, the TFT characteristics can be further stabilized.

The semiconductor device 100 can be used for, for example, an active matrix substrate of a display apparatus. The active matrix substrate includes a display region (active region) contributing to display and a peripheral region (frame region) located outside the display region.

As illustrated in FIG. 1(b), a plurality of gate lines G and a plurality of source lines S are arranged in the display region. Regions surrounded by these lines serve as "pixels". The plural pixels are arranged in a matrix. The transparent conductive layers (pixel electrodes) 19 are arranged on the respective pixels. The transparent conductive layers 19 are isolated from each other for each pixel. The TFTs 101 in the pixels are arranged in the vicinities of intersections of the plural source lines S and the plural gate lines G. The drain electrodes 9D of the TFT 101 are electrically connected to the respective pixel electrodes 19. The source lines S may be integrally formed with the respective source electrodes 9S of the TFT 101. The gate lines G may be integrally formed with the gate electrodes 3 of the TFT 101.

The semiconductor device 100 according to this embodiment may further include another electrode layer functioning as a common electrode on the pixel electrodes 19 or between the interlayer insulating layer 13 and the pixel electrodes 19.

<Method for Producing Semiconductor Device 100>

An example of a method for producing the TFT 101 will be described below with reference to the drawings.

Figure 14:
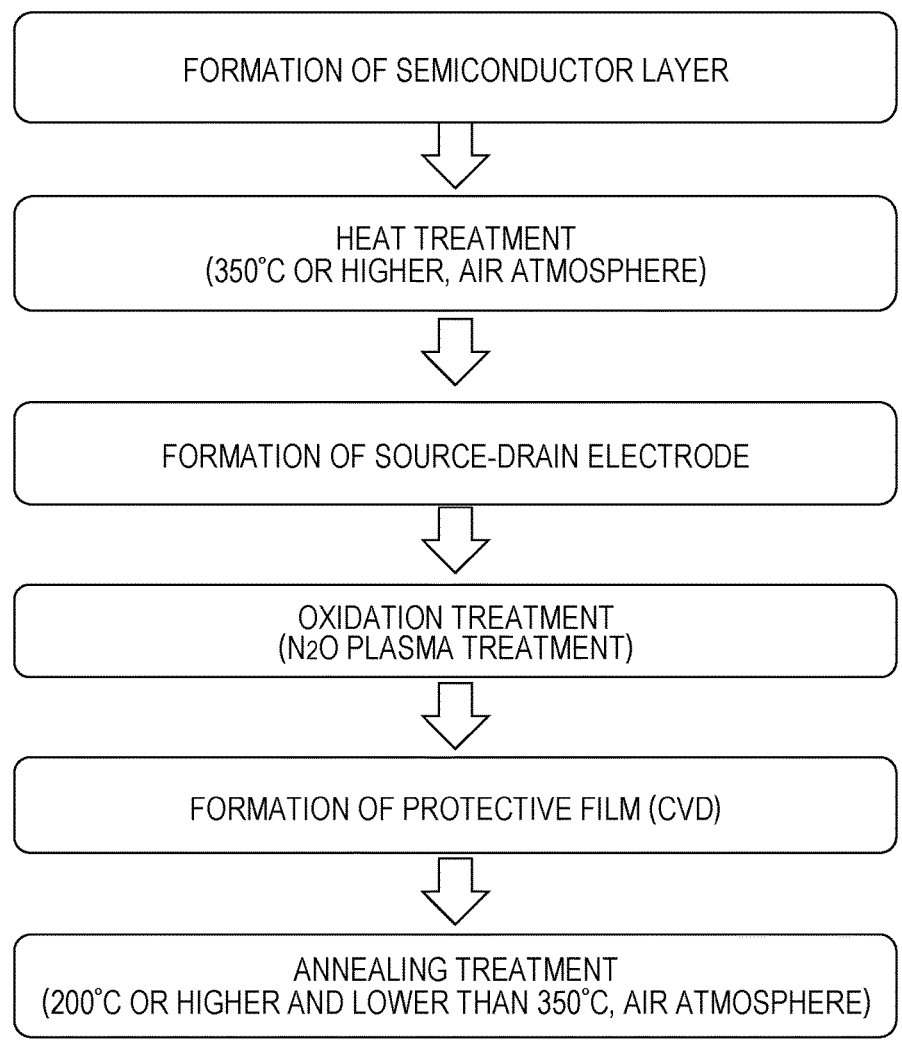
FIG. 14 illustrates an example of a method for producing a TFT according to the first embodiment.

FIG. 14 illustrates the production procedure of the TFTs 101. As illustrated in FIG. 14, first, an oxide semiconductor film is patterned to form the semiconductor layers 7. Heat treatment is performed at a temperature of, for example, 350° C. or higher. Then the source electrodes 9S and the drain electrodes 9D in contact with the semiconductor layers 7 are formed to obtain the TFTs 101. Subsequently, the semiconductor layers 7 are subjected to oxidation treatment such as plasma treatment, and then the protective film 11 that covers the TFTs 101 is formed. After this, annealing treatment is performed at a temperature of, for example, 200° C. or higher and lower than 350° C.

In this embodiment, after the formation of the protective film 11 on the semiconductor layers 7, the annealing treatment is performed at a predetermined temperature. This oxidizes the semiconductor layers 7 to enable oxygen deficiency that has occurred in the semiconductor layer 7 during the formation of the protective film 11 to be reduced.

In general, an oxide semiconductor layer such as an In—Ga—Zn—O-based semiconductor layer or an In—Sn—Zn—O-based semiconductor layer is subjected to oxidation treatment (for example, $N_2O$ plasma treatment) in order to reduce oxygen deficiency occurring in the oxide semiconductor layer. However, the inventors have conducted studies and have found that even if the oxide semiconductor layer is subjected to oxidation treatment, the subsequent formation of a protective film reduces the oxide semiconductor layer to cause oxygen deficiency, resulting in low resistance. A portion of the oxide semiconductor layer in this state in the vicinity of its surface on the side of the protective film has a low oxygen concentration. The oxide semiconductor layer can be conductive, depending on the conditions of formation of the protective film. Use of the low-resistance oxide semiconductor layer as it is makes it difficult to provide stable TFT characteristics. In the case where a plurality of TFTs are formed on a substrate, uniform TFT characteristics on the same plane of the substrate is difficult to provide.

To deal with the problems, the inventors have found that annealing treatment at a predetermined temperature after the formation of the protective film can reduce the oxygen deficiency occurring in the oxide semiconductor layer. Effects obtained by the annealing treatment will be described below by specific examples.

Figure 15:
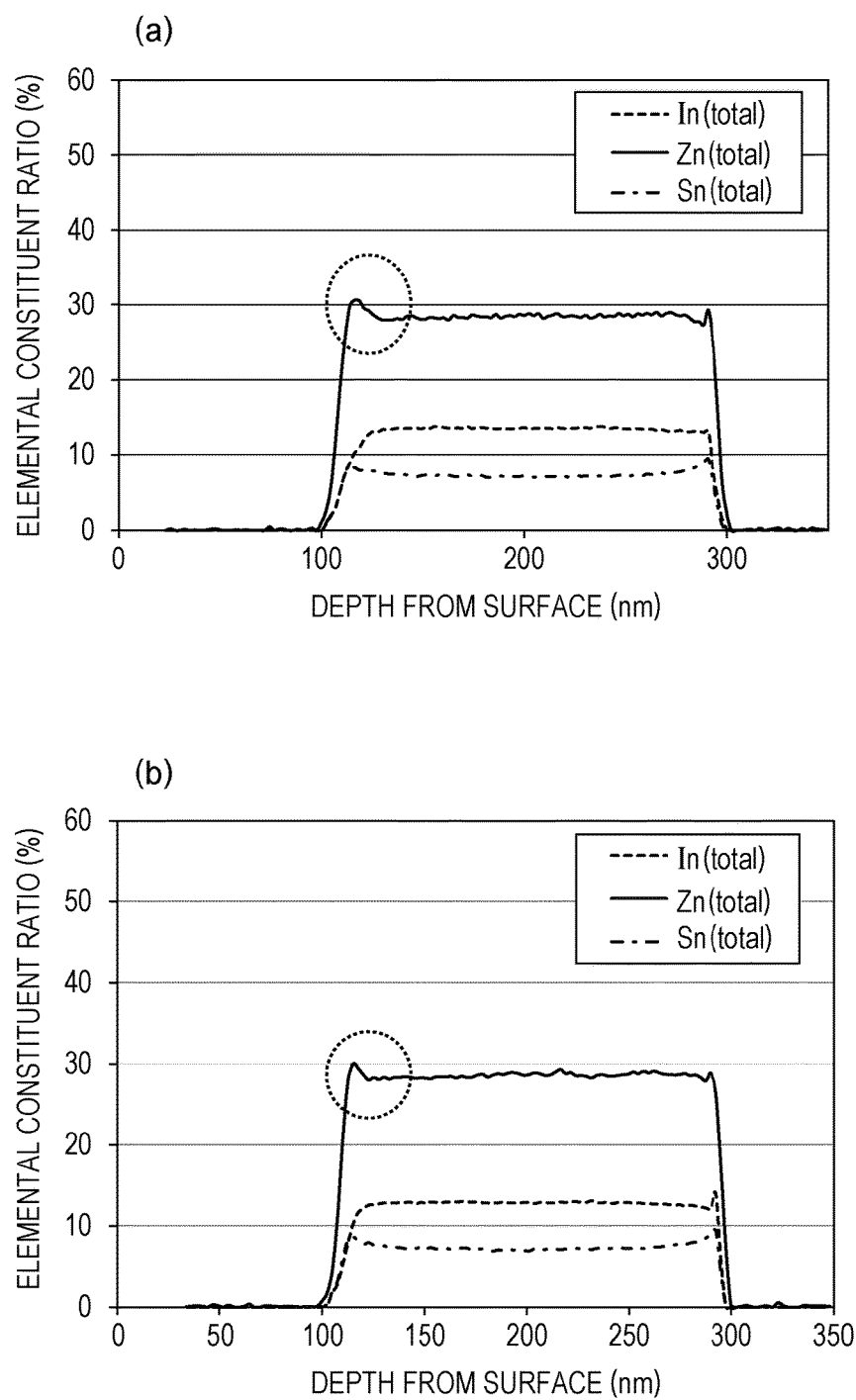
FIGS. 15(a) and (b) illustrate the profiles of elements of samples of Reference example 1 in the depth direction, each of the samples including a single In—Sn—Zn—O-based semiconductor layer, (a) illustrating the profiles when annealing treatment was not performed after the formation of a protective film, (b) illustrating the profiles when annealing treatment was performed at 250° C. after the formation of the protective film.

FIG. 15 illustrates the profiles of elements in the depth direction in a sample including an In—Sn—Zn—O-based semiconductor layer (single layer) according to Reference example 1. FIG. 15(*a*) illustrates the profiles after a protective film is formed on the In—Sn—Zn—O-based semiconductor layer and then no annealing treatment is performed. FIG. 15(*b*) illustrates the profiles after the protective film is formed and then the annealing treatment is performed at 250° C.

As illustrated in FIG. 15(*a*), the percentage of Zn has a maximum value in the vicinity of the upper surface of the In—Sn—Zn—O-based semiconductor layer immediately after the formation of the protective film. As described above with reference to FIG. 11, this indicates that a local region having a low oxygen concentration is formed. As illustrated in FIG. 15(*b*), when the annealing treatment is performed, the maximum value of Zn is lower than that before the annealing treatment (immediately after the protective film). This indicates that the annealing treatment increases the oxygen concentration (minimum value) in the vicinity of the upper surface of the semiconductor layer.

Also in a sample including an In—Ga—Zn—O-based semiconductor layer (single layer), a local region having a low oxygen concentration is formed in the vicinity of the upper surface of the In—Ga—Zn—O-based semiconductor layer immediately after the formation of a protective film (not illustrated), and the oxygen concentration has a minimum value. When the annealing treatment is performed after the formation of the protective film, as with Reference example 1 (FIG. 15), the oxygen concentration is increased in the vicinity of the upper surface of the In—Ga—Zn—O-based semiconductor layer. In the case of the In—Ga—Zn—O-based semiconductor layer, it seems that the oxygen concentration is increased by the annealing treatment, so that the minimum value of the oxygen concentration is not observed (see FIG. 11(*b*)).

The foregoing results indicate that the annealing treatment after the formation of the protective film can passivate oxygen defects formed in the vicinity of the surface of the oxide semiconductor layer during the formation of the protective film.

Thus, in the production method illustrated in FIG. 14, a local region having a low oxygen concentration is formed in the vicinity of the upper surface of the semiconductor layer 7 (here, in the vicinity of the upper surface of the In—Ga—Zn—O-based semiconductor layer) after the formation of the protective film 11 and before the annealing treatment. That is, the oxygen concentration in the In—Ga—Zn—O-based semiconductor layer in the depth direction seems to have a minimum value in the vicinity of its surface adjacent to the protective film 11. The subsequent annealing treatment seemingly oxidizes the semiconductor layer 7 to reduce the oxygen deficiency in the vicinity of the upper surface of the In—Ga—Zn—O-based semiconductor layer, so that the oxygen concentration does not have a minimum value.

The inventors have further conducted studies and have found that even if the annealing treatment is performed after the formation of the protective film 11, stable TFT characteristics can fail to be provided, depending on the annealing temperature. The study results will be described in detail. The annealing temperature is set to, for example, lower than 350° C., preferably 300° C. or lower. When the annealing temperature is low (for example, lower than 200° C.) or when the annealing treatment is not performed after the formation of the protective film 11, oxygen defects formed in the semiconductor layer 7 is not easily passivated by the formation of the protective film 11, in some cases. Thus, a low-oxygen-concentration region formed in the vicinity of a surface of the semiconductor layer 7 (here, an In—Ga—Zn—O-based semiconductor layer) remains as it is, possibly failing to provide desired TFT characteristics. The "annealing temperature" used in this specification refers to the temperature of the annealing treatment performed after the formation of the protective film 11, unless otherwise specified.

Figure 1:
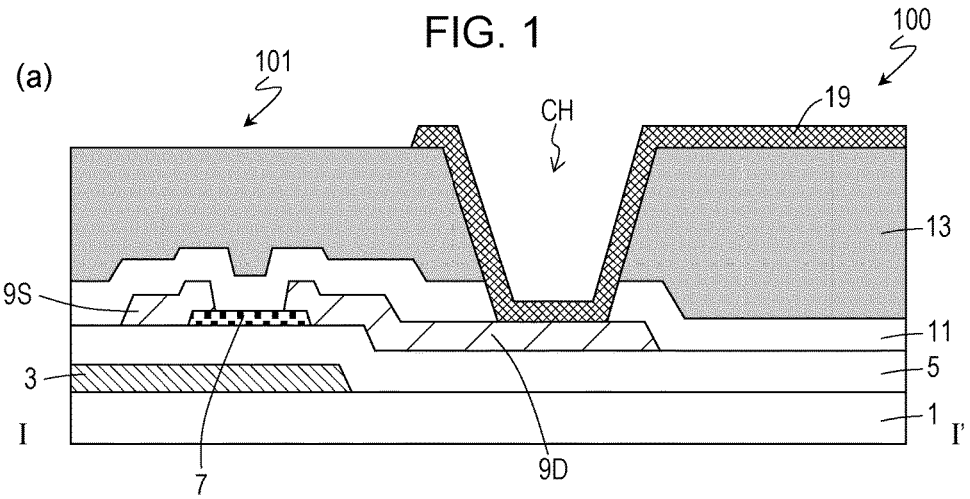
FIGS. 1(a) and (b) are a schematic cross-sectional view and a schematic plan view, respectively, of a semiconductor device 100 according to a first embodiment, and (c) is an enlarged cross-sectional view of a semiconductor layer 7 of the semiconductor device 100.
Figure 1:
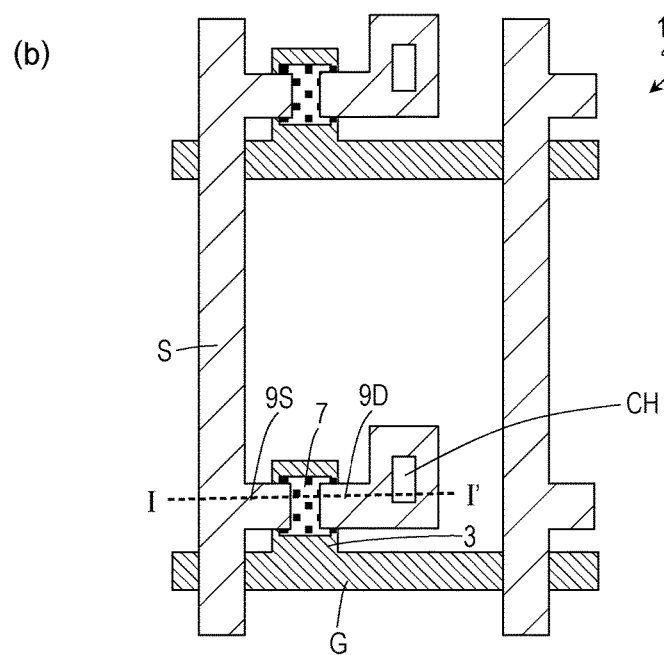
Figure 1:
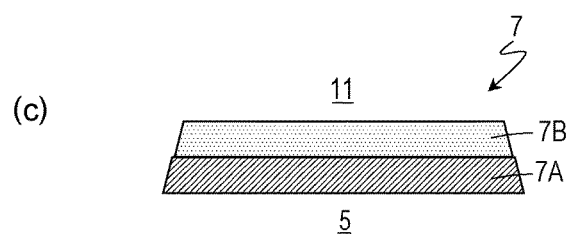

With reference to FIGS. 1(*a*) to 1(*c*) again, a method for producing the semiconductor device 100 will be more specifically described below.

The gate electrodes 3, the gate lines G, and the gate insulating layer 5 are formed, in this order, on the substrate 1.

As the substrate 1, for example, a glass substrate, a silicon substrate, or a heat-resistant plastic substrate (resin substrate) may be used.

The gate electrodes 3 can be integrally formed with the respective gate lines G. Here, a gate line metal film (thickness: for example, 50 nm or more and 500 nm or less) (not illustrated) is formed by, for example, a sputtering method on the substrate 1 (for example, a glass substrate). Then patterning the gate line metal film forms the gate electrodes 3 and the gate lines G. As the gate line metal film, for example, a stacked film (W/TaN film) including a 300-nm-thick W film serving as an upper layer and a 20-nm-thick TaN film serving as a lower layer is used. The materials of the gate line metal film are not particularly limited. A film containing a metal, such as aluminum (Al), tungsten (W), molybdenum (Mo), tantalum (Ta), chromium (Cr), titanium (Ti), or copper (Cu), an alloy thereof, or a metal nitride thereof can be appropriately used.

The gate insulating layer 5 can be formed by, for example, a CVD method. As the gate insulating layer 5, for example, a silicon oxide ($SiO_2$) layer, a silicon nitride (SiNx) layer, a silicon oxynitride (SiOxNy, x>y) layer, or a silicon nitroxide (SiNxOy, x>y) can be appropriately used. The gate insulating layer 5 may have a laminated structure. For example, a silicon nitride layer, a silicon oxynitride layer, or the like (lower layer) is formed on the side of the substrate in order to prevent the diffusion of impurities and so forth from the substrate 1. A silicon oxide layer, a silicon oxynitride layer, or the like (upper layer) may be formed thereon in order to ensure insulation. Here, a stacked film including a 50-nm-thick $SiO_2$ film serving as an upper layer and a 300-nm-thick SiNx film serving as a lower layer is used. As described above, when an oxygen-containing insulating layer (for example, an oxide layer such as $SiO_2$) is used as the uppermost layer of the gate insulating layer 5 (that is, a layer to be in contact with an oxide semiconductor layer), if oxygen deficiency occurs in the semiconductor layer 7, the oxygen deficiency can be compensated with oxygen contained in the oxide layer. Thus, the oxygen deficiency in the semiconductor layer 7 can be reduced.

Subsequently, the semiconductor layers 7 including the first oxide semiconductor layer 7A and the second oxide semiconductor layer 7B are formed on the gate insulating layer 5.

The semiconductor layers 7 are formed by a first oxide semiconductor film containing In, Sn, and Zn and a second oxide semiconductor film containing In and Ga are formed, in this order, on the gate insulating layer 5, and patterning the resulting stacked film. Here, by, for example, a sputtering method, a 35-nm-thick In—Sn—Zn—O-based semiconductor film is formed as the first oxide semiconductor film, and a 35-nm-thick In—Ga—Zn—O-based semiconductor film is formed as the second oxide semiconductor film. At least part of each of the semiconductor layers 7 is arranged so as to overlap a corresponding one of the gate electrodes 3 with the gate insulating layer 5 provided therebetween when viewed from the normal direction of the substrate 1. After the semiconductor layers 7 are formed by patterning, heat treatment may be performed at 350° C. or higher (for example, 450° C.) in an air atmosphere.

The thickness of the first oxide semiconductor film to be formed into the first oxide semiconductor layer 7A is, for example, 2 nm or more and 100 nm or less. At a thickness of 2 nm or more, electrons move more preferentially through the first oxide semiconductor layer 7A than the second oxide semiconductor layer 7B; thus, a high-mobility TFT can be produced. At a thickness of 100 nm or less, On/Off operations can be performed at higher speed by a gate voltage. The thickness of the second oxide semiconductor film to be formed into the second oxide semiconductor layer 7B is, for example, 5 nm or more and 100 nm or less. At a thickness of 5 nm or more, the precipitation of Zn and Sn in the vicinity of the upper surface of the first oxide semiconductor layer 7A can be more effectively inhibited. At a thickness of 100 nm or less, a resistance component caused by the second oxide semiconductor layer 7B can be reduced to inhibit a reduction in the mobility of the TFT.

Here, the semiconductor layer 7 used in this embodiment is described. The oxide semiconductor contained in each of the first oxide semiconductor layer 7A and the second oxide semiconductor layer 7B may be an amorphous oxide semiconductor or a crystalline oxide semiconductor containing a crystalline portion. Examples of the crystalline oxide semiconductor include polycrystalline oxide semiconductors, microcrystalline oxide semiconductors, and crystalline oxide semiconductors whose c-axes are oriented almost perpendicular to layer surfaces.

Each of the first and second oxide semiconductor layers 7A and 7B may be an amorphous oxide semiconductor layer or a crystalline oxide semiconductor layer. For example, the first oxide semiconductor layer 7A may be an amorphous In—Sn—Zn—O-based semiconductor layer, and the second oxide semiconductor layer 7B may be an amorphous In—Ga—Zn—O-based semiconductor layer. Preferably, the first oxide semiconductor layer 7A is an amorphous oxide semiconductor (for example, an amorphous In—Sn—Zn—O-based semiconductor layer), and the second oxide semiconductor layer 7B is a crystalline oxide semiconductor layer (for example, a crystalline In—Ga—Zn—O-based semiconductor layer). The energy gap of the oxide semiconductor contained in the second oxide semiconductor layer 7B serving as the upper layer is preferably larger than the energy gap of the oxide semiconductor contained in the first oxide semiconductor layer 7A serving as the lower layer. However, when the difference in energy gap between these layers is relatively small, the energy gap of the oxide semiconductor in the lower layer may be larger than the energy gap of the oxide semiconductor in the upper layer.

The materials, the structures, and the film-formation methods of the amorphous oxide semiconductor and the crystalline oxide semiconductors, the structure of the oxide semiconductor layer having a laminated structure, and so forth are described in, for example, Japanese Unexamined Patent Application Publication No. 2014-007399. Japanese Unexamined Patent Application Publication No. 2014-007399 is hereby incorporated by reference herein in its entirety.

In this embodiment, the second oxide semiconductor layer 7B may contain, for example, an In—Ga—Zn—O-based semiconductor or an In—Ga—O-based semiconductor. The In—Ga—Zn—O-based semiconductor used here is a ternary oxide of In (indium), Ga (gallium), and Zn (zinc). The composition ratio of In to Ga to Zn is not particularly limited. Examples thereof include In:Ga:Zn=2:2:1, In:Ga:Zn=1:1:1, In:Ga:Zn=1:1:2, In:Ga:Zn=1:3:2, and In:Ga:Zn=1:3:6. The oxide semiconductor layer can be formed from an oxide semiconductor film containing the In—Ga—Zn—O-based semiconductor. As described above, in this embodiment, the composition ratio of Ga or Zn in the In—Ga—Zn—O-based semiconductor is preferably higher than the composition ratio of In. In this case, the stability and the blocking properties of the material against plasma damage during the formation of the protective film can be improved to more effectively inhibit a decrease in the resistance of the lower layer. Thus, among the composition ratios described above, for example, In:Ga:Zn=1:1:2, In:Ga:Zn=1:3:2, or In:Ga:Zn=1:3:6 is preferred.

The In—Ga—Zn—O-based semiconductor may be amorphous or crystalline. As the crystalline In—Ga—Zn—O-based semiconductor, a crystalline In—Ga—Zn—O-based semiconductor whose c-axis is oriented almost perpendicular to its layer surface is preferred.

The crystal structure of the crystalline In—Ga—Zn—O-based semiconductor is disclosed in, for example, Japanese Unexamined Patent Application Publication No. 2014-007399 described above, Japanese Unexamined Patent Application Publication No. 2012-134475, and Japanese Unexamined Patent Application Publication No. 2014-209727. Japanese Unexamined Patent Application Publication Nos. 2012-134475 and 2014-209727 are hereby incorporated by reference herein in their entirety. TFTs including the In—Ga—Zn—O-based semiconductor layer have high mobility (more than 20 times that of a-Si TFT) and low leakage current (less than one hundredth of that of a-Si TFT) and thus are suitably used as driving TFTs and pixel TFTs.

The first oxide semiconductor layer 7A may contain, for example, an In—Sn—Zn—O-based semiconductor (for example, $In_2O_3$—$SnO_2$—ZnO) or an In—Al—Sn—Zn—O-based semiconductor. Here, the In—Sn—Zn—O-based semiconductor is a ternary oxide of In (indium), Sn (tin), and Zn (zinc). The composition of the In—Sn—Zn—O-based semiconductor is not particularly limited. Letting the number of indium atoms be [In], letting the number of tin atoms be [Sn], and letting the number of zinc atoms be [Zn], for example, the following formulae are preferably satisfied:

$$0.2 < [In]/([In]+[Sn]+[Zn]) < 0.4$$

$$0.1 < [Sn]/([In]+[Sn]+[Zn]) < 0.4$$

$$0.2 < [Zn]/([In]+[Sn]+[Zn]) < 0.7$$

The oxide semiconductor contained in the semiconductor layer 7 is not limited to the foregoing materials. The semiconductor layer 7 may further include a layer composed of another oxide semiconductor such as an In—Al—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, a Zr—In—Zn—O-based semiconductor, or a Hf—In—Zn—O-based semiconductor.

The source-drain electrodes 9 are then formed so as to be in contact with the upper surface of the semiconductor layer 7. The source-drain electrodes 9 may have a single-layer structure or may have a laminated structure. Here, a laminated film is formed as a source line metal film, the laminated film including a Ti film (thickness: 30 nm), an Al or Cu film (thickness: 300 nm), and a Ti film (thickness: 50 nm) stacked, in this order, from the side of the semiconductor layer 7. The source line metal film is formed by, for example, a sputtering method.

Subsequently, the source line metal film is patterned to form the source electrodes 9S, the drain electrodes 9D, and the source lines S. Each of the source electrodes 9S is arranged so as to be in contact with the source contact region of a corresponding one of the semiconductor layers 7. Each of the drain electrodes 9D is arranged so as to be in contact with the drain contact region of a corresponding one of the semiconductor layers 7. A portion of each of the semiconductor layers 7 located between a corresponding one of the source electrodes 9S and a corresponding one of the drain electrodes 9D is formed into a channel region. Thereby, TFTs 101 are produced.

Subsequently, the channel regions of the semiconductor layers 7 are subjected to oxidation treatment. Here, plasma treatment with $N_2O$ gas is performed. Treatment conditions are not particularly limited. The pressure of the $N_2O$ gas is set at, for example, 100 Pa or more and 300 Pa or less. The plasma power density is set at 0.2 W/cm$^2$ or more and 1.5 W/cm$^2$ or less. The treatment time is set at 5 to 100 seconds. The substrate temperature is set at, for example, 200° C. or higher and 450° C. or lower, preferably 200° C. or higher and 350° C. or lower, more preferably 200° C. or higher and 300° C. or lower.

The oxidation treatment is not limited to the plasma treatment with $N_2O$ gas. For example, the oxidation treatment can be performed by, for example, plasma treatment with $O_2$ gas or ozone treatment. Even when another treatment method is employed, a suitable treatment temperature range is the same as the range described above.

To perform the treatment without increasing the number of steps, the treatment is preferably performed just before the step of forming the protective film 11. Specifically, in the case where the protective film 11 is formed by a CVD method, $N_2O$ plasma treatment may be performed. In the case where the protective film 11 is formed by a sputtering method, $O_2$ plasma treatment may be performed. Alternatively, oxidation treatment may be performed by $O_2$ plasma treatment with an asking apparatus.

Next, the protective film 11 is formed so as to be in contact with the channel regions of the TFTs 101. The protective film 11 may be an inorganic insulating layer such as a silicon oxide ($SiO_2$) film, a silicon nitride (SiNx) film, a silicon oxynitride (SiOxNy, x>y) film, or a silicon nitroxide (SiNxOy, x>y) film. Here, as the protective film 11, a $SiO_2$ layer having a thickness of, for example, 300 nm is formed by a CVD method. The temperature of the formation of the protective film 11 may be, for example, 200° C. or higher and 450° C. or lower, preferably 200° C. or higher and 350° C. or lower, more preferably 200° C. or higher and 300° C. or lower.

After the protective film 11 is formed, heat treatment is performed at, for example, 200° C. or higher and lower than 350° C., preferably 250° C. or higher and lower than 350° C., more preferably 250° C. or higher and 300° C. or lower. This can reduce the oxygen deficiency occurring in the semiconductor layers 7 during the formation of the protective film 11.

Then the interlayer insulating layer 13 is formed on the protective film 11. The interlayer insulating layer 13 may be, for example, an organic insulating layer. Here, a positive-type photosensitive resin film having a thickness of, for example, 2,000 nm is formed, and the photosensitive resin film is patterned. Thereby, opening portions to expose the protective film 11 are formed in portions located above the drain electrodes 9D. Then portions of the protective film 11 located in the opening portions are removed with the interlayer insulating layer 13 as a mask. In this way, the contact holes CH that expose the drain electrodes 9D are formed in the interlayer insulating layer 13 and the protective film 11. The interlayer insulating layer 13 may be, for example, an inorganic insulating layer.

Next, a transparent conductive film (not illustrated) is formed by, for example, a sputtering method on the interlayer insulating layer 13 and in the contact holes CH and is then patterned to form the pixel electrodes 19 in contact with the drain electrodes 9D in the contact holes CH. As the transparent conductive film, for example, an indium-tin oxide (ITO) film, an IZO film, or a ZnO film (zinc oxide film) can be used. Here, an IZO film having a thickness of, for example, 100 nm is used as the transparent conductive film.

The semiconductor device according to this embodiment may further include another electrode layer functioning as a common electrode on the transparent conductive layers (pixel electrodes) 19 or between the interlayer insulating layer 13 and the transparent conductive layers 19. In this case, a semiconductor device including two-layer transparent electrode layers is obtained. The semiconductor device can be used for, for example, an FFS-mode display apparatus.

The TFT 101 illustrated in FIG. 1 has a channel-etched structure. In the "channel-etched-type TFT", as illustrated in FIG. 1, an etch stop layer is not formed on the channel region, and end portions of the source-drain electrodes 9 located on the channel side are arranged so as to be in contact with the upper surface of the semiconductor layer 7. The channel-etched-type TFT is formed by, for example, forming a conductive film for the source-drain electrodes on the semiconductor layer 7 and performing the source-drain isolation. In the source-drain isolation step, a surface portion of the channel region is etched, in some cases. To reduce damage to the semiconductor layer 7 in the source-drain isolation step, oxidation treatment such as $NO_2$ plasma treatment may be performed after the formation of the semiconductor layer 7 and before the formation of the protective film 11.

The structure of the TFT according to this embodiment is not limited to the structure illustrated in FIG. 1. In the TFT in which one of the upper surface and the lower surface of the semiconductor layer is in contact with the gate insulating layer and the other is in contact with the $SiO_2$-containing insulating layer (also referred to as a "first insulating layer"), the first oxide semiconductor layer may be arranged on the gate insulating layer side with respect to the second oxide semiconductor layer. The first insulating layer may be a protective film, an etch stop layer, or an underlying layer formed on the substrate.

The TFT according to this embodiment may have an etch stop structure including an etch stop that covers the channel region. As the etch stop layer, an oxygen-containing insulating layer such as a $SiO_2$ layer is used. In the TFT having the etch stop structure, end portions of the source-drain electrodes on the channel side are located on, for example, an etch stop layer. The etch stop-type TFT is formed by, for example, forming an etch stop layer that covers a portion of the upper surface of the semiconductor layer to be formed into a channel region, forming a conductive film for the source-drain electrodes on the semiconductor layer and the etch stop layer, and performing source-drain isolation. Also in the case of the TFT having the etch stop structure, when the TFT includes the semiconductor layer having the laminated structure as described above, the same effects as above are obtained.

In the TFT 101 illustrated in FIG. 1, although the gate electrode 3 is arranged on the side of the substrate 1 with respect to the semiconductor layer 7 (bottom gate structure), the gate electrode 3 may be arranged above the semiconductor layer 7 (top gate structure). The TFT according to this embodiment may have a top contact structure in which the source-drain electrodes are in contact with the upper surface of the semiconductor layer or may have a bottom contact structure in which the source-drain electrodes are in contact with the lower surface of the semiconductor layer. Regardless of the structure of the TFT, when the semiconductor layer having the laminated structure including the first oxide semiconductor layer and the second oxide semiconductor layer arranged on the back channel side of the first oxide semiconductor layer, the foregoing effects are provided. The "second oxide semiconductor layer arranged on the back channel side of the first oxide semiconductor layer" indicates that the second oxide semiconductor layer is arranged on a surface of the first oxide semiconductor layer opposite to the surface adjacent to the gate insulating layer.

In a conventional In—Sn—Zn—O-based semiconductor TFT having a top gate structure, in the case where an oxygen-containing insulating film such as a $SiO_2$ layer is arranged as an underlying film on the lower surface of a semiconductor layer, the oxygen concentration can be decreased in a portion of an In—Sn—Zn—O-based semiconductor layer adjacent to the underlying film (back channel side) to increase the carrier concentration. In contrast, by arranging the second oxide semiconductor layer 7B such as an In—Ga—Zn—O-based semiconductor layer on the back channel side of the first oxide semiconductor layer 7A, an increase in carrier concentration occurring on the back channel side of the semiconductor layer 7 can be inhibited to inhibit an increase in off-leakage current, a decrease in TFT characteristics, or the like.

FIG. 11(c) indicates that in the conventional In—Sn—Zn—O-based semiconductor TFT, a problem due to the decrease in oxygen concentration (aggregation of Zn) occurring on the back channel side of the In—Sn—Zn—O-based semiconductor layer is particularly noticeable in a bottom-gate-structure TFT having a channel-etched structure. This is because oxygen defects on the upper surface of the In—Sn—Zn—O-based semiconductor layer are easily formed by damage during channel etching. Furthermore, the reason for this is presumably that the interaction with the $SiO_2$ layer is further increased to further decrease the oxygen concentration on the upper surface side of the In—Sn—Zn—O-based semiconductor layer during the formation of the protective film and heat treatment. Thus, in the case where the oxide semiconductor TFT according to this embodiment has a channel-etched structure, significantly advantageous effects are provided.

(Analytical Result of Semiconductor Layer 7 Having Laminated Structure)

The inventors have produced a plurality of analysis samples including In—Ga—Zn—O-based semiconductors having different compositions, the samples being subjected to annealing treatment at different temperatures after the formation of the protective films, and have evaluated the TFT characteristics. The results are described.

A method for producing samples 1 to 6 for analysis is described below. As the gate insulating layer, a SiNx layer (thickness: 325 nm) and a $SiO_2$ layer (thickness: 50 nm) were formed, in this order, on the substrate. An amorphous In—Sn—Zn—O-based semiconductor layer (thickness: 100 nm) was formed as the first oxide semiconductor layer, and a crystalline In—Ga—Zn—O-based semiconductor layer (thickness: 100 nm) whose c-axis is oriented almost perpendicular to its layer surface was formed as the second oxide semiconductor layer. The composition ratio of In to Sn to Zn in the In—Sn—Zn—O-based semiconductor was about 2:1:4. The composition ratio of In to Ga to Zn in the In—Ga—Zn—O-based semiconductor in each of the samples was 1:1:1 or 1:3:6 as listed in Table 1. Then oxidation treatment was performed. The oxidation treatment was performed under conditions: a N$_2$O gas pressure of 200 Pa and a plasma power density of 1.0 W/cm$^2$. The oxidation treatment time was 30 seconds for each sample. Subsequently, a SiO$_2$ layer (thickness: 300 nm) was formed as a protective film so as to cover the semiconductor layer. After the formation of the protective film, annealing treatment was performed. The annealing temperature was 250° C., 300° C., or 350° C. as listed in Table 1.

TABLE 1

| Sample | Composition of In—Ga—Zn—O-based semiconductor (In:Ga:Zn) | Annealing treatment (° C.) | Threshold voltage Vth |
|---|---|---|---|
| 1 | 1:1:1 | 250 | 0.77 |
| 2 | 1:1:1 | 300 | 0.53 |
| 3 | 1:1:1 | 350 | poor characteristics |
| 4 | 1:3:6 | 250 | 2.20 |
| 5 | 1:3:6 | 300 | 2.49 |
| 6 | 1:3:6 | 350 | poor characteristics |

Evaluation of TFT Characteristics of Samples

TFTs were produced under the same conditions as those in samples 1 to 6 for analysis. The current-voltage characteristics thereof were evaluated.

Figure 9:
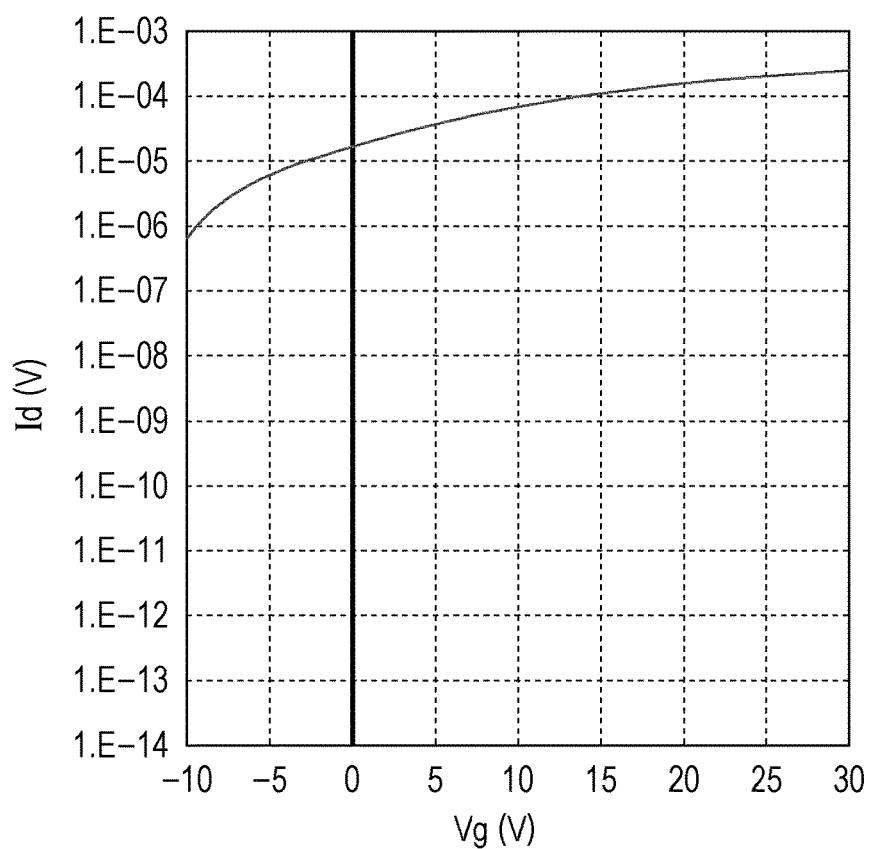
FIG. 9 illustrates the current-voltage characteristics of a TFT of sample 6.

Table 1 lists the threshold voltage Vth of each sample. The results indicate that samples 1, 2, 4, and 5 exhibit good TFT characteristics and that each of samples 4 and 5 has a higher threshold voltage Vth than samples 1 and 2. In each of samples 3 and 6, even when a negative bias is applied as a gate voltage, the channel cannot be switched to an off state (see FIG. 9). Thus, they were evaluated to be "poor characteristics".

It is thus found that at a higher annealing temperature (350° C. or higher), the TFT characteristics tend to be degraded. It is also found that samples 4 and 5, in which the composition ratio of the In—Ga—Zn—O-based semiconductor is 1:3:6, have more stable TFT characteristics than samples 1 and 2, in which the composition ratio of the In—Ga—Zn—O-based semiconductor is 1:1:1.

Profile of Percentage of Metal Present in Sample in Depth Direction

Elements in samples 1 to 6 were analyzed in the depth direction by Auger electron spectroscopy. In this analysis, the bonding states of metals were also analyzed. In the following description, a metal having an oxide bonding state (a metal included in a metal oxide) is referred to as a "metal in an oxide state". A metal having a metallic bonding state is referred to as a "metal in a pure state". For example, in the case of indium, indium included in In$_2$O$_3$ is referred to as an "In in an oxide state". Metallic indium is referred to as an "In in a pure state". A metal M in an oxide state, a metal M in a pure state, and a metal M including all bonding states are also expressed as "M (oxide)", "M (pure)", and "M (total)", respectively.

FIGS. 3 to 8 illustrate the analytical results of the constituent ratios of metal elements in samples 1 to 6 in the depth direction. The horizontal axis represents the depth from the upper surface (the upper surface of the SiO$_2$ layer) of each of the samples. (a) of each figure illustrates the constituent ratio of the elements in the depth direction. The constituent ratio refers to a constituent ratio of the total amount of each metal in the pure and oxide states, i.e., In (total), Sn (total), Zn (total), and Ga (total). (b) of each figure illustrates the constituent ratio of the metals in the pure state, i.e., In (pure), Sn (pure), and Zn (pure). (c) of each figure illustrates the percentage of the amount of each metal in the pure state with respect to the total amount of the metal. (d) of each figure illustrates the percentage of Sn in the pure state with respect to the total amount of Sn.

As illustrated in FIGS. 3(a) to 8(a), in any sample, the arrangement of the In—Ga—Zn—O-based semiconductor layer between the In—Sn—Zn—O-based semiconductor layer and the SiO$_2$ layer inhibits the aggregation of Zn in a portion of the In—Sn—Zn—O-based semiconductor layer on the side of its upper surface. In any sample, In in the pure state is present in the In—Ga—Zn—O-based semiconductor layer in an amount of 10% or more (for example, about 10% to about 30%). However, in the In—Sn—Zn—O-based semiconductor layer, In in the pure state is present in an amount of less than 10% (here, several percent or less). Thus, most of In in the In—Sn—Zn—O-based semiconductor layer is present in the oxide state. This indicates that the In—Sn—Zn—O-based semiconductor layer maintains the oxide state, which is not reduced, in the thickness direction.

The analytical results of the constituent ratio of the metals in the pure states illustrated in FIGS. 8(b) and 8(c) indicate that in sample 6, In in the pure state and Sn in the pure state are precipitated at the interface between the In—Ga—Zn—O-based semiconductor layer and the In—Sn—Zn—O-based semiconductor layer. This phenomenon is not observed in the analytical results of other samples illustrated in FIGS. 3(b) to 7(b). In sample 6, thus, the annealing at a high temperature (350° C.) seemingly causes the formation of a low-crystallinity region at the interface between the In—Ga—Zn—O-based semiconductor and the In—Sn—Zn—O-based semiconductor, precipitating the metals in the pure states in this region.

The percentages of Sn in the pure state, Sn (pure)/Sn (total), of the samples at the interface between the In—Ga—Zn—O-based semiconductor layer and the In—Sn—Zn—O-based semiconductor layer are compared with each other. As illustrated in FIGS. 3(d) to 8(d), in samples 4 and 5, the percentage of Sn in the pure state is 40% or less, whereas sample 6, in which the oxidation treatment was performed at a higher temperature, the percentage of Sn in the pure state is 100%. In samples 1 to 3, in which the composition of the In—Ga—Zn—O-based semiconductor is 1:1:1, the percentage of Sn in the pure state is 70% or more and 90% or less. The reason Sn (pure)/Sn (total) of each of samples 4 and 5 is lower than that of each of samples 1 to 3 is presumably that the In—Ga—Zn—O-based semiconductor layer of each of samples 4 and 5 contains large amounts of Ga and Zn (see FIG. 12), which are not easily reduced. Thus, when the percentage of Sn in the pure state, Sn (pure)/Sn (total), is, for example, 90% or less at the interface between the In—Ga—Zn—O-based semiconductor layer and the In—Sn—Zn—O-based semiconductor layer, the degradation of TFT characteristics can be inhibited. More preferably, the percentage of Sn in the pure state is 40% or less. In this case, desired TFT characteristics can be more reliably provided.

In sample 3, at the interface between the In—Ga—Zn—O-based semiconductor layer and the In—Sn—Zn—O-based semiconductor layer, a region where the percentage of Sn in the pure state, Sn (pure)/Sn (total), is relatively high (for example, 50% or more) extends in the thickness direction, compared with other samples. In this example, a region where Sn (pure)/Sn (total) is 50% or more has a thickness of about 10 nm. Thus, although the maximum value of Sn (pure)/Sn (total) is comparable to those of samples 1 and 2, Sn in the pure state is precipitated in a larger amount. This can result in a decrease in threshold voltage Vth.

The foregoing results indicate that in the case where Sn (pure)/Sn (total) is 90% or less and where a region in which Sn (pure)/Sn (total) is 50% or more has a thickness of less than 10 nm at the interface between the In—Ga—Zn—O-based semiconductor layer and the In—Sn—Zn—O-based semiconductor layer, more stable TFT characteristics are provided.

Next, the following facts are revealed by focusing attention on the constituent ratio of the metal elements at the interface between the In—Sn—Zn—O-based semiconductor layer and the SiO$_2$ layer. As illustrated in FIGS. 3(c) and 3(d) to 8(c) and 8(d), in any sample, In, Zn, and Sn in the pure states are precipitated at the interface between the In—Sn—Zn—O-based semiconductor and the SiO$_2$ layer. In samples 4 to 6, in which the composition ratio of the In—Ga—Zn—O-based semiconductor is In:Ga:Zn=1:3:6, percentages of In, Zn, and Sn in the pure states are lower than those of samples 1 to 3, in which In:Ga:Zn=1:1:1. As illustrated in FIGS. 6(c) to 8(c), for example, in each of samples 4 to 6, the percentage of Zn (pure) with respect to Zn (total) is 50% or less at the interface between the In—Sn—Zn—O-based semiconductor and the SiO$_2$ layer. As illustrated in FIGS. 6(b) to 8(b), the percentage of Zn in the pure state is, for example, 15% or less at the interface between the In—Sn—Zn—O-based semiconductor and the SiO$_2$ layer. This is presumably because the In—Ga—Zn—O-based semiconductor layer of each of samples 4 to 6 contains large amounts of Ga and Zn (see FIG. 12), which are not easily reduced, and thus has a high degree of blocking properties against plasma damage during the formation of the protective film. The results indicate that in the case where the composition ratio of Ga or Zn in the In—Ga—Zn—O-based semiconductor is low and where the composition ratio of In is high, Sn in the pure state and In in the pure state are easily precipitated, i.e., a region to be reduced is easily formed. In other words, oxygen deficiency causing low resistance seems to occur easily.

For example, in each of samples 1 to 3, the ratio of the number of Ga atoms to the total of the metal elements in the In—Ga—Zn—O-based semiconductor ([Ga]/[In]+[Ga]+[Zn], hereinafter, referred to simply as "the composition ratio of Ga") is equal to the ratio of the number of In atoms to the total of the metal elements ([In]/[In]+[Ga]+[Zn], hereinafter, referred to simply as "the composition ratio of In"). In each of samples 4 to 6, however, the composition ratio of Ga is three times the composition ratio of In. Thus, a high composition ratio of Ga in the In—Ga—Zn—O-based semiconductor enables the semiconductor layer to have high resistance to reduction. The composition ratio of Ga may be higher than the composition ratio of In (Ga>In). The composition ratio of Ga to the total of the metal elements in the In—Ga—Zn—O-based semiconductor may be higher than ⅓.

The oxidation treatment conditions, the annealing temperature, the composition and the thickness of the semiconductor layer, and so forth are not limited to the foregoing examples, and various changes may be made. Even in the case where they are changed, the same effects are provided as long as the profiles of the elements in the depth direction satisfy the foregoing relationships. For example, when the percentage of Sn in the pure state, Sn (pure)/Sn (total), is 90% or less, preferably 40% or less at the interface between the first oxide semiconductor layer containing In, Sn, and Zn and the second oxide semiconductor layer containing In and Ga, the degradation of TFT characteristics can be inhibited. This structure can be provided by, for example, allowing the percentage of Ga in the second oxide semiconductor layer to be higher than the percentage of In or setting the annealing temperature at, for example, lower than 350° C., preferably 300° C. or lower. In addition, the same effects are also provided by appropriately changing the conditions, such as the oxidation treatment time and the thickness of the In—Ga—Zn—O-based semiconductor layer and the In—Sn—Zn—O-based semiconductor layer, other than the annealing temperature or the composition ratio of the In—Ga—Zn—O-based semiconductor, as long as the foregoing relationship (Sn (pure)/Sn (total)≤90%) is satisfied.

(Relationship Between Composition of Second Oxide Semiconductor Layer and Threshold Voltage of TFT)

The relationship between the composition of the second oxide semiconductor layer and the threshold voltage was studied.

TFTs of Examples 1 to 3 were produced, each of the TFTs including an In—Sn—Zn—O-based semiconductor layer (thickness: 35 nm) serving as the first oxide semiconductor layer and an In—Ga—Zn—O-based semiconductor layer (thickness: 35 nm) serving as the second oxide semiconductor layer. Table 2 lists the composition ratios of In to Ga to Zn in the In—Ga—Zn—O-based semiconductor layer of Examples 1 to 3. The annealing temperature after the formation of the protective film was 300° C., and the heat treatment time was 1 hours.

For comparison, a TFT of a comparative example was produced, the TFT including an active layer formed of a single In—Sn—Zn—O-based semiconductor layer (thickness: 35 nm). The annealing conditions were the same as those in Examples 1 to 3.

The current-voltage characteristics of the TFTs of Examples 1 to 3 and Comparative example 1 were studied. The results are described in Table 2 and FIGS. 10(a) to 10(d).

TABLE 2

| | Composition of second oxide semiconductor layer In:Ga:Zn | Threshold voltage Vth [V] | Mobility μ [cm$^2$/Vs] |
|---|---|---|---|
| Example 1 | 1:1:1 | 0.77 | 21.7 |
| Example 2 | 1:3:2 | 1.72 | 20.3 |
| Example 3 | 1:3:6 | 2.49 | 18.6 |
| Comparative example 1 | — | −2.48 | 38.3 |

Figure 10:
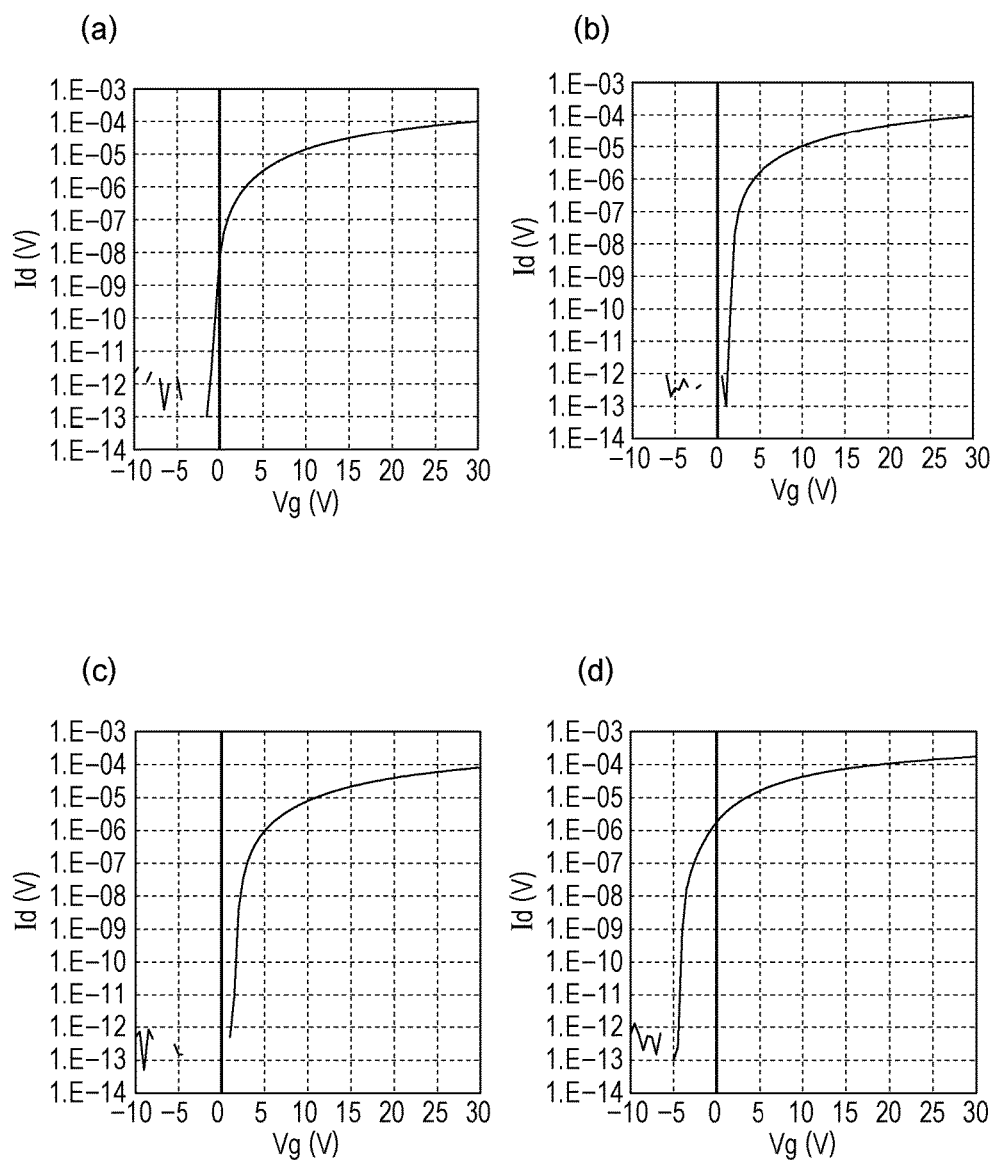
FIG. 10(a) to (d) illustrate the current-voltage characteristics of TFTs of Examples 1 to 3 and Comparative example 1.

FIG. 10(d) indicates that the TFT of Comparative example 1, in which the single In—Sn—Zn—O-based semiconductor layer is used the active layer, has normally-on characteristics, in which off characteristics are not obtained even at a Vg of 0 V. The reason for this is presumably that, as described above with reference to FIG. 11, a reduction reaction occurred on the back channel side of the In—Sn—Zn—O-based semiconductor layer to decrease the oxygen concentration and to increase the carrier concentration. In contrast, the TFTs of Examples 1 to 3, each of the TFTs having a laminated structure of the In—Ga—Zn—O-based semiconductor layer and the In—Sn—Zn—O-based semiconductor layer, have normally-off characteristics. The reason for this is presumably that the arrangement of the In—Ga—Zn—O-based semiconductor layer inhibited the reduction reaction occurring on the back channel side of the In—Sn—Zn—O-based semiconductor layer to reduce an increase in the resistivity of the active layer.

For example, comparisons of the current-voltage characteristics of the TFTs of Examples 1 to 3 indicate that a lower composition ratio of In to the total of the metal elements in the In—Ga—Zn—O-based semiconductor layer ([In]/([In]+[Ga]+[Zn]), in other words, a greater percentage of Ga or Zn, results in a higher absolute value of Vth; hence, stable characteristics are provided. Furthermore, the threshold voltage (Vth) can be controlled by changing the composition of the In—Ga—Zn—O-based semiconductor layer.

As described above, the composition of the second oxide semiconductor layer can be selected, depending on a desired threshold voltage. When the composition ratio of In to the total of the metal elements in the second oxide semiconductor layer ([In]/([In]+[Ga]+[Zn]) is, for example, 1/6 or less, preferably 1/10 or less, more stable current-voltage characteristics can be provided.

The second oxide semiconductor layer may contain an oxide semiconductor other than the In—Ga—Zn—O-based semiconductor. For example, an In—Ga—O-based semiconductor may be contained. In this case, the composition ratio of Ga in the In—Ga—O-based semiconductor may be higher than the composition ratio of In, in other words, the composition ratio of In (([In]/([In]+[Ga]) may be less than 1/2. This results in more stable characteristics.

This embodiment is suitably applied to active matrix substrates including oxide semiconductor TFTs. Active matrix substrates can be used for, for example, various display apparatuses, such as liquid crystal display apparatuses, organic EL display apparatuses, and inorganic EL display apparatuses, and electronic apparatuses including display devices. In active matrix substrates, oxide semiconductor TFTs can be used not only as switching elements arranged in pixels but also as circuit elements such as drivers of peripheral circuits (monolithic). In this case, the oxide semiconductor TFT according to the present invention includes the oxide semiconductor layer having high mobility (for example, 10 cm$^2$/Vs or more) serving as an active layer and thus is suitably used as a circuit element.

INDUSTRIAL APPLICABILITY

The present invention can be widely applied to oxide semiconductor TFTs and various semiconductor devices including oxide semiconductor TFTs. For example, the present invention is applied to circuit substrates such as active matrix substrates, display apparatuses such as liquid crystal display apparatuses, organic electroluminescent (EL) display apparatuses, inorganic electroluminescent display apparatuses, and MEMS display apparatuses, image capturing apparatuses such as image sensors, and various electronic apparatuses such as image input apparatuses, finger print readers, and semiconductor memories.

REFERENCE SIGNS LIST 1 substrate
3 gate electrode
5 gate insulating layer
7 semiconductor layer (active layer)
7A first oxide semiconductor layer
7B second oxide semiconductor layer
9S source electrode
9D drain electrode
11 protective film
13 interlayer insulating layer
19 transparent conductive layer (pixel electrode)
100 semiconductor device

The invention claimed is:

1. A semiconductor device comprising:
a substrate, a thin-film transistor supported on the substrate, and a first insulating layer,
the thin-film transistor including a semiconductor layer, a gate electrode, a gate insulating layer arranged between the gate electrode and the semiconductor layer, a source electrode, and a drain electrode, the source electrode and the drain electrode being in contact with the semiconductor layer, wherein
one of an upper surface and a lower surface of the semiconductor layer is in contact with the gate insulating layer, the other is in contact with the first insulating layer,
the semiconductor layer has a laminated structure including a first oxide semiconductor layer and a second oxide semiconductor layer, the first oxide semiconductor layer is arranged on a gate insulating layer side of the second oxide semiconductor layer and is in contact with the second oxide semiconductor layer,
the first insulating layer contains silicon oxide,
the second oxide semiconductor layer contains In and Ga and does not contain Sn,
the first oxide semiconductor layer contains In, Sn, and Zn,
a percentage of Zn in the first oxide semiconductor layer in a depth direction does not have a maximum value in a vicinity of a surface of the first oxide semiconductor layer adjacent to the second oxide semiconductor layer,
a percentage of Sn having a metallic bonding state at an interface between the first oxide semiconductor layer and the second oxide semiconductor layer is 90% or less with respect to a total amount of Sn, and
a region where the percentage of Sn having the metallic bonding state at the interface between the first oxide semiconductor layer and the second oxide semiconductor layer is 50% or more with respect to the total amount of Sn has a thickness of less than 10 nm.

2. The semiconductor device according to claim 1, wherein the percentage of Sn having the metallic bonding state at the interface between the first oxide semiconductor layer and the second oxide semiconductor layer is 40% or less with respect to the total amount of Sn.

3. The semiconductor device according to claim 1, wherein a composition ratio of Ga contained in the second oxide semiconductor layer is higher than a composition ratio of In contained in the second oxide semiconductor layer.

4. The semiconductor device according to claim 1, wherein the first oxide semiconductor layer is in contact with the gate insulating layer, and a percentage of Zn having a metallic bonding state at an interface between the first oxide semiconductor layer and the gate insulating layer is 50% or less with respect to a total amount of Zn.

5. The semiconductor device according to claim 1, wherein the second oxide semiconductor layer is in contact with the first insulating layer, and
a percentage of oxygen in the second oxide semiconductor layer in the depth direction does not have a minimum value in a vicinity of a surface of the second oxide semiconductor layer adjacent to the first insulating layer.

6. The semiconductor device according to claim 1, wherein a percentage of In having a metallic bonding state in the second oxide semiconductor layer is 10% or more with respect to a total amount of In, and the percentage of In having the metallic bonding state in the first oxide semiconductor layer is less than 10% with respect to the total amount of In.

7. The semiconductor device according to claim 1, wherein the first oxide semiconductor layer contains an In—Sn—Zn—O-based semiconductor.

8. The semiconductor device according to claim 1, wherein the second oxide semiconductor layer contains an In—Ga—Zn—O-based semiconductor.

9. The semiconductor device according to claim 1, wherein the second oxide semiconductor layer contains an In—Ga—O-based semiconductor.

10. The semiconductor device according to claim 1, wherein the second oxide semiconductor layer contains a crystalline portion.

11. The semiconductor device according to claim 1, wherein the first oxide semiconductor layer is in contact with the gate insulating layer, and the second oxide semiconductor layer is in contact with the first insulating layer.

12. The semiconductor device according to claim 1, wherein the gate electrode is arranged between the semiconductor layer and the substrate,
each of the source electrode and the drain electrode is in contact with part of the upper surface of the semiconductor layer, and
the first insulating layer is a protective film covering the thin-film transistor and is in contact with a portion of the upper surface of the semiconductor layer located between the source electrode and the drain electrode.

13. The semiconductor device according to claim 1, wherein the gate electrode is arranged between the semiconductor layer and the substrate,
each of the source electrode and the drain electrode is in contact with part of the upper surface of the semiconductor layer, and
the first insulating layer is arranged between the semiconductor layer and the source electrode and the drain electrode, and the first insulating layer is in contact with a portion of the upper surface of the semiconductor layer located between the source electrode and the drain electrode.

14. The semiconductor device according to claim 1, further comprising a third oxide semiconductor layer between the first oxide semiconductor layer and the gate insulating layer, wherein the third oxide semiconductor layer contains In and Ga and does not contain Sn.

15. A method for producing a semiconductor device, comprising the steps of:
(A) forming a gate electrode and a gate insulating layer covering the gate electrode on a substrate;
(B) forming a semiconductor layer having a laminated structure on the gate insulating layer, the semiconductor layer including a first oxide semiconductor layer and a second oxide semiconductor layer, the step (B) including the substeps of:
forming the first oxide semiconductor layer containing In, Sn, and Zn; and
forming the second oxide semiconductor layer that contains In and Ga and that does not contain Sn so as to be in contact with an upper surface of the first oxide semiconductor layer;
(C) forming a source electrode and a drain electrode in contact with the semiconductor layer to provide a thin-film transistor; and
(D) forming a first insulating layer containing silicon oxide so as to cover the thin-film transistor, wherein
after the step (D), the method further comprises a step of subjecting the substrate including the semiconductor layer to annealing treatment at a temperature of 300° C. or lower,
a percentage profile of Zn in the first oxide semiconductor layer in a depth direction does not have a maximum value in a vicinity of a surface of the first oxide semiconductor layer adjacent to the second oxide semiconductor layer,
a percentage of Sn having a metallic bonding state at an interface between the first oxide semiconductor layer and the second oxide semiconductor layer is 90% or less with respect to a total amount of Sn, and
a region where the percentage of Sn having the metallic bonding state at the interface between the first oxide semiconductor layer and the second oxide semiconductor layer is 50% or more with respect to the total amount of Sn has a thickness of less than 10 nm.

16. The method for producing a semiconductor device according to claim 15, wherein a composition ratio of Ga contained in the second oxide semiconductor layer is higher than a composition ratio of In contained in the second oxide semiconductor layer.

17. The method for producing a semiconductor device according to claim 15, wherein the first oxide semiconductor layer contains an In—Sn—Zn—O-based semiconductor.

18. The method for producing a semiconductor device according to claim 15, wherein the second oxide semiconductor layer contains an In—Ga—Zn—O-based semiconductor.

19. The method for producing a semiconductor device according to claim 15, wherein the second oxide semiconductor layer contains a crystalline portion.

* * * * *